(12) United States Patent
Chang et al.

(10) Patent No.: US 12,261,082 B2
(45) Date of Patent: Mar. 25, 2025

(54) SEMICONDUCTOR DEVICES WITH A NITRIDED CAPPING LAYER

(71) Applicant: Taiwan Semiconductor Manufacturing Co., Ltd., Hsinchu (TW)

(72) Inventors: Po-Chin Chang, Taichung (TW); Lin-Yu Huang, Hsinchu (TW); Shuen-Shin Liang, Hsinchu (TW); Sheng-Tsung Wang, Hsinchu (TW); Cheng-Chi Chuang, New Taipei (TW); Chia-Hung Chu, Taipei (TW); Tzu Pei Chen, Hsinchu (TW); Yuting Cheng, Hsinchu (TW); Sung-Li Wang, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 451 days.

(21) Appl. No.: 17/577,707

(22) Filed: Jan. 18, 2022

(65) Prior Publication Data
US 2023/0029002 A1 Jan. 26, 2023

Related U.S. Application Data

(60) Provisional application No. 63/224,897, filed on Jul. 23, 2021.

(51) Int. Cl.
*H01L 21/768* (2006.01)
*H01L 23/535* (2006.01)

(52) U.S. Cl.
CPC .. *H01L 21/76849* (2013.01); *H01L 21/76805* (2013.01); *H01L 21/7684* (2013.01);
(Continued)

(58) Field of Classification Search
CPC .................................................... H01L 23/535
See application file for complete search history.

(56) References Cited

U.S. PATENT DOCUMENTS 6,140,024 A * 10/2000 Misium ............. H01L 21/76826
430/316
6,174,823 B1 * 1/2001 Dobson ............. H01L 21/76856
257/E21.162

(Continued)

*Primary Examiner* — Britt D Hanley
*Assistant Examiner* — Vicki B. Booker
(74) *Attorney, Agent, or Firm* — Sterne, Kessler, Goldstein & Fox P.L.L.C.

(57) ABSTRACT

The present disclosure describes a semiconductor device with a nitrided capping layer and methods for forming the same. One method includes forming a first conductive structure in a first dielectric layer on a substrate, depositing a second dielectric layer on the first conductive structure and the first dielectric layer, and forming an opening in the second dielectric layer to expose the first conductive structure and a portion of the first dielectric layer. The method further includes forming a nitrided layer on a top portion of the first conductive structure, a top portion of the portion of the first dielectric layer, sidewalls of the opening, and a top portion of the second dielectric layer, and forming a second conductive structure in the opening, where the second conductive structure is in contact with the nitrided layer.

20 Claims, 29 Drawing Sheets

(52) U.S. Cl.
CPC .. *H01L 21/76846* (2013.01); *H01L 21/76871* (2013.01); *H01L 21/76895* (2013.01); *H01L 23/535* (2013.01)

(56) References Cited

U.S. PATENT DOCUMENTS

| | | | | |
|---|---|---|---|---|
| 6,358,849 | B1 * | 3/2002 | Havemann | H01L 21/76867 |
| | | | | 257/E21.546 |
| 7,727,882 | B1 * | 6/2010 | Wu | H01L 23/53238 |
| | | | | 438/643 |
| 8,962,479 | B2 * | 2/2015 | Yang | H01L 21/76829 |
| | | | | 257/E21.582 |
| 9,006,064 | B2 * | 4/2015 | Chudzik | H01L 21/0228 |
| | | | | 257/411 |
| 10,115,670 | B2 * | 10/2018 | Edelstein | H01L 21/76877 |
| 2006/0183327 | A1 * | 8/2006 | Moon | H01L 21/76856 |
| | | | | 438/687 |
| 2021/0202310 | A1 * | 7/2021 | Hsieh | H01L 23/5283 |

* cited by examiner

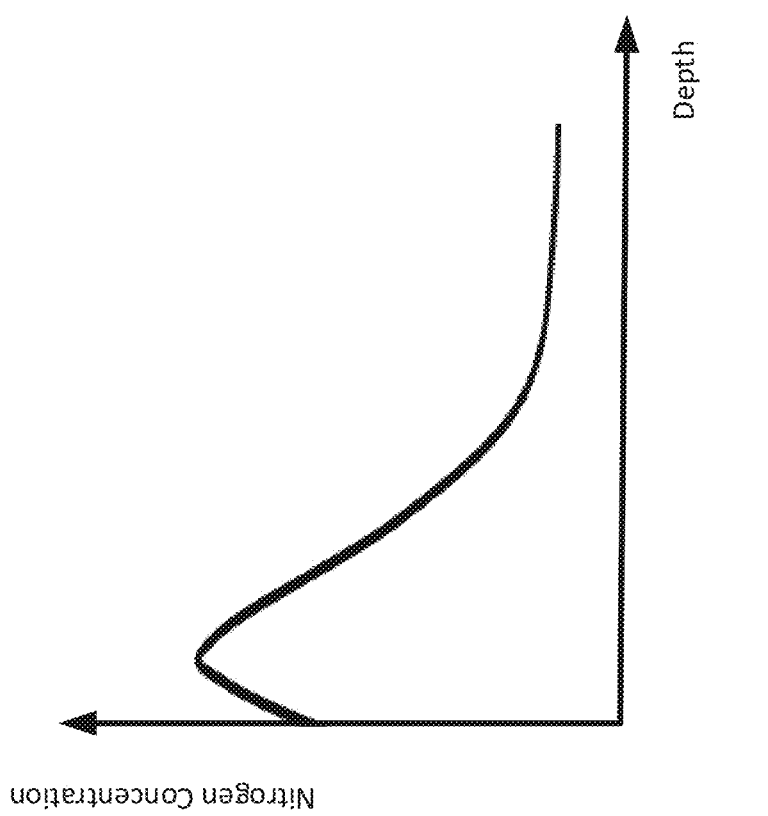

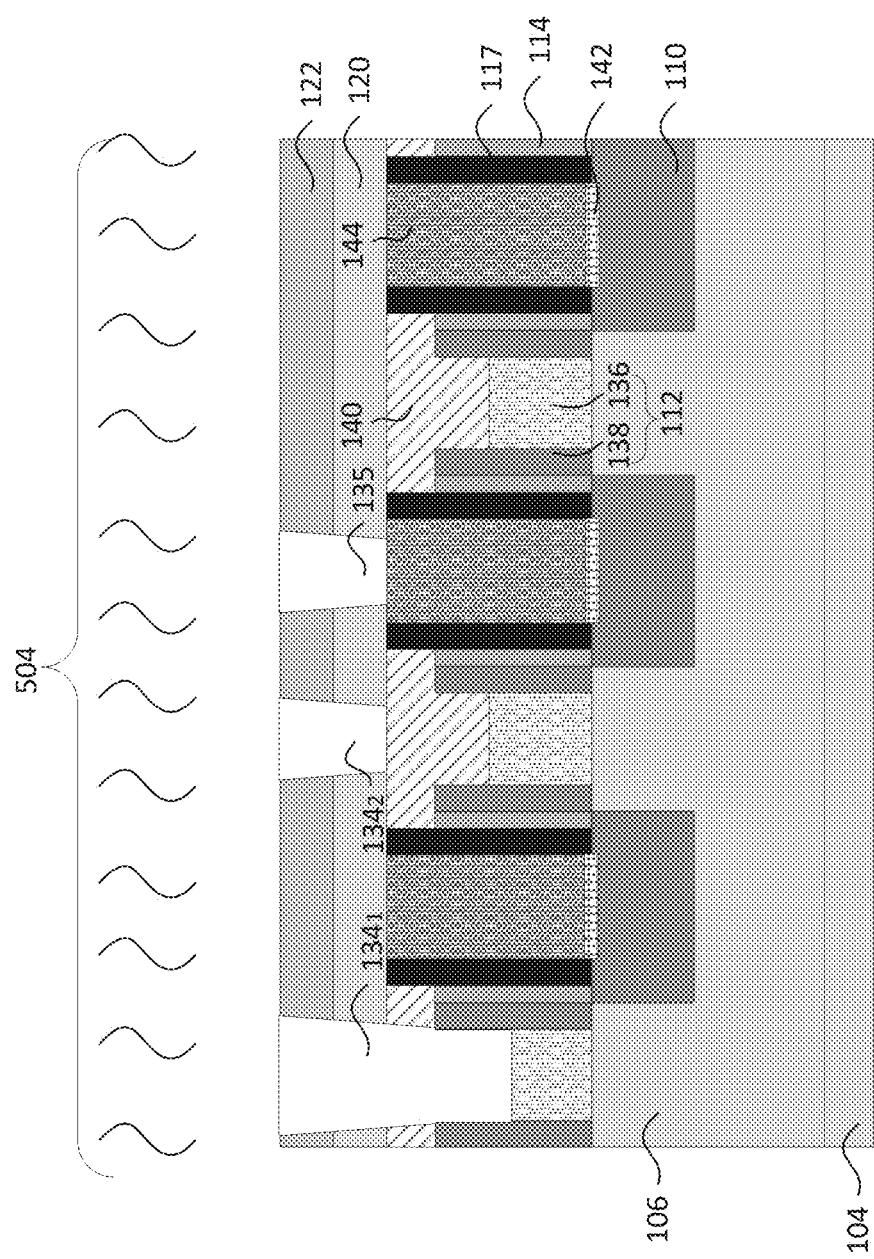
FIG. 12
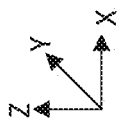

SEMICONDUCTOR DEVICES WITH A NITRIDED CAPPING LAYER

CROSS-REFERENCE TO RELATED APPLICATION

This application claims the benefit of U.S. Provisional Patent Application No. 63/224,897, filed on Jul. 23, 2021 and titled "Nitrided Capping Layer to Mitigate Metal Line Metal Diffusion," the disclosure of which is incorporated by reference herein in its entirety.

BACKGROUND

Advances in semiconductor technology have increased the demand for semiconductor devices with higher storage capacity, faster processing systems, higher performance, and lower costs. To meet these demands, the semiconductor industry continues to scale down the dimensions of semiconductor devices and increase the complexity of circuit connections. The increased circuitry complexity requires multiple layers of interconnects and more contacts between metal lines and metal vias.

BRIEF DESCRIPTION OF THE DRAWINGS

Aspects of this disclosure are best understood from the following detailed description when read with the accompanying figures.

FIGS. 12-19 illustrate cross-sectional views of a semiconductor device with a nitrided capping layer at various stages of its fabrication process, according to some embodiments.

DETAILED DESCRIPTION

Figure 1A:
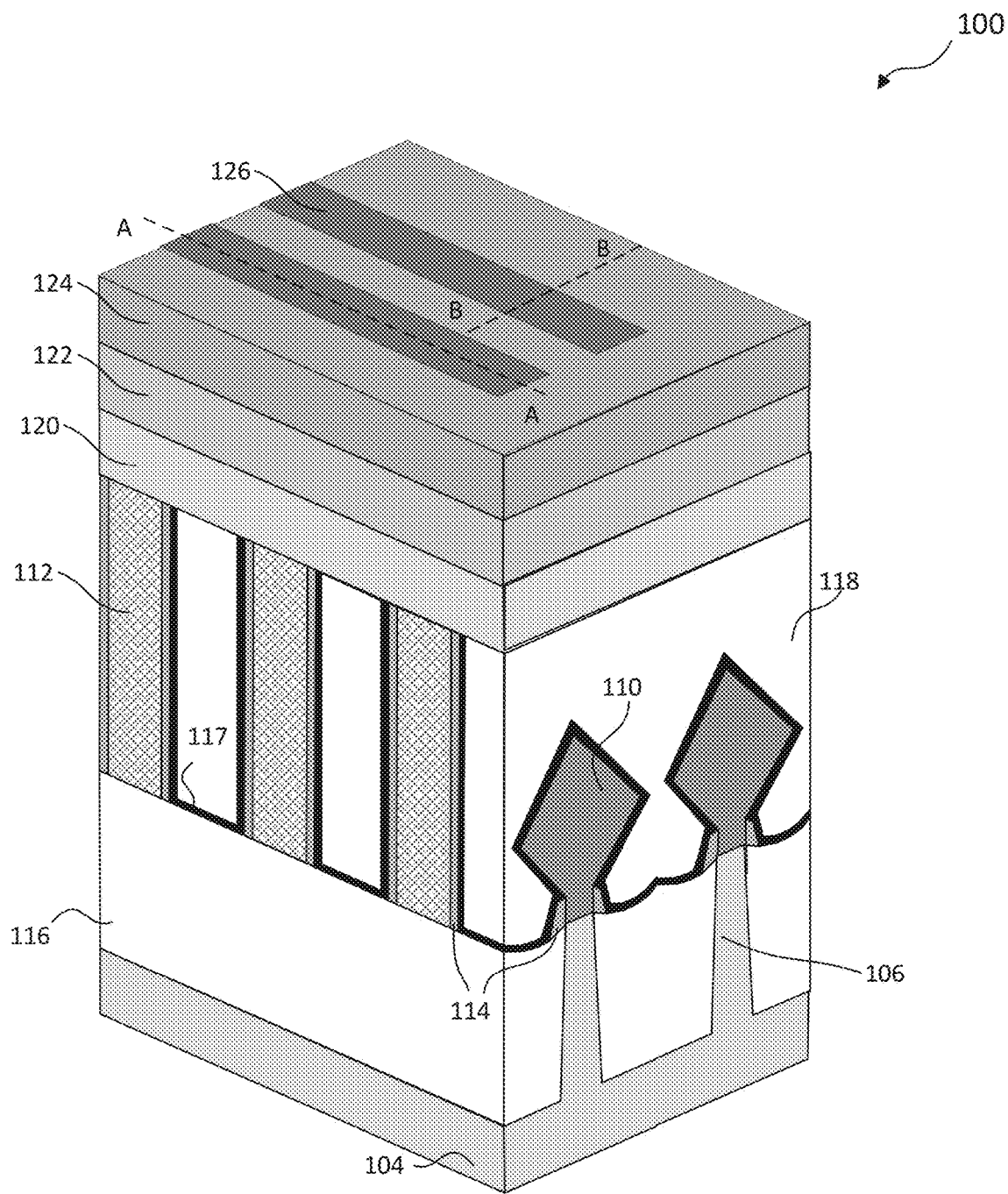
FIG. 1A illustrates an isometric view of a semiconductor device with interconnect structures, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

Fins associated with fin field effect transistors (finFETs) or gate-all-around (GAA) FETs may be patterned by any suitable method. For example, the fins may be patterned using one or more photolithography processes, including double-patterning or multi-patterning processes. Double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The discussion of elements in FIGS. 1A-1I, 3-6A, 7-10, 12, 13A, and 14-19 with the same annotations applies to each other, unless mentioned otherwise.

Technology advances in the semiconductor industry drive the pursuit of integrated circuits (IC)s having higher device density, higher performance, and lower costs. To meet these demands, the semiconductor industry continues to scale down the dimensions of semiconductor devices and increase the complexity of circuit connections. The increased circuitry complexity requires multiple layers of interconnects and more contacts between metal lines and metal vias. With the miniaturization of the interconnect structures to achieve ICs with higher device densities, the current density in the metal lines of the interconnect structures increases. The increased current density can cause metal electromigration from the metal lines to the metal vias. The electromigration can cause device failures and reduce device performance and reliability. To reconcile the electromigration, barrier layers can be deposited before the metal lines are formed. However, such barrier layers can introduce extra resistance between the metal lines and the metal vias, thus degrading the performance of the IC.

The present disclosure provides example FET devices (e.g., GAA FETs, finFETs, and planar FETs) with a nitrided capping layer in a semiconductor device and/or in an IC and example methods for fabricating the same. The nitrided capping layer can be formed on the metal vias and between the metal lines and the metal vias. The nitrided capping layer can provide low resistance and reduce (or prevent) electromigration from the metal lines to the metal vias. There can be two methods for forming the nitrided capping layer on the metal vias.

In the first method, a metal line dielectric layer can be formed on the metal vias. A metal line opening can be formed in the metal line dielectric layer to expose the metal vias. The nitrided capping layer can be formed on the metal vias and the sidewalls of the metal line opening. The nitrided capping layer can be formed by nitridation treatment and nitrogen ion implantation. A seed metal layer can be deposited in the metal line opening and the metal line can be formed on the seed metal layer. In some embodiments, barrier layers with reduced thicknesses (e.g., thickness reduced by about 20% to about 80%) can be formed before the seed metal layer and the metal line can be formed in the metal line opening.

In the second method, the nitrided capping layer can be formed on the metal vias before the metal line dielectric layer is formed on the metal vias. The nitrided capping layer can be formed by nitridation treatment and nitrogen ion implantation. After the nitrided capping layer is formed, the metal line dielectric layer can be formed on the nitrided capping layer and the metal line opening can be formed in the metal line dielectric layer. The seed metal layer can be deposited in the metal line opening and the metal line can be formed on the seed metal layer. In some embodiments, barrier layers with reduced thicknesses (e.g., thickness reduced by about 20% to about 80%) can be formed before the seed metal layer and the metal line can be formed in the metal line opening.

Because the nitrided capping layer can reduce (or prevent) electromigration from the metal lines to the metal vias, the barrier layers can be eliminated or have reduced thicknesses (e.g., thickness reduced by about 20% to about 80%). Since the nitrided capping layer has a lower resistance than the barrier layers, a benefit of the present disclosure, among others, is to lower the resistance and the signal delay (e.g., RC delay) in the interconnect structures, thus enhancing the overall performance and yield of the IC.

According to some embodiments, FIG. 1A illustrates an isometric view of a FET 100 with interconnect structures. In some embodiments, FET 100 can represent a finFET 100 and a GAA FET 100. In some embodiments, FET 100 can represent n-type FET 100 (NFET 100) and p-type FET 100 (PFET 100) and the discussion of FET 100 applies to both NFET 100 and PFET 100, unless mentioned otherwise. FIGS. 1B, 1D, 1F, and 1H illustrate cross-sectional views of FET 100 along the line A-A in FIG. 1A showing relative positions between metal vias $134_1$, $134_2$, and 135, nitrided capping layer 133, and metal line 126. FIGS. 1C, 1E, 1G, and 1I illustrate cross-sectional views of FET 100 along the line B-B in FIG. 1A showing relative positions between metal via 135, nitrided capping layer 133, and metal line 126. The discussion of elements in FIGS. 1A-1I with the same annotations applies to each other, unless mentioned otherwise.

Referring to FIGS. 1A, 1B, 1D, 1F, and 1H, FET 100 can include gate structures 112 disposed on fin structures 106. In some embodiments, gate structures 112 of GAA FET 100 can include nanostructured gate regions (not shown in FIGS. 1A-1I). Referring to FIGS. 1A-1I, FET 100 can include S/D regions 110 disposed on portions of fin structures 106 that are adjacent to gate structures 112. FET 100 can further include gate spacers 114. Referring to FIGS. 1A, 1C, 1E, 1G, and 1I, FET 100 can further include shallow trench isolation (STI) regions 116. Referring to FIGS. 1A-1I, FET 100 can further include etch stop layers (ESLs) 117. Referring to FIGS. 1A, 1C, 1E, 1G, and 1I, FET 100 can further include interlayer dielectric (ILD) layers 118. ILD layers 118 can be disposed on ESLs 117. In some embodiments, gate spacers 114, STI regions 116, ESLs 117, and ILD layers 118 can include an insulating material, such as silicon oxide ($SiO_x$), silicon nitride (SiN), silicon carbon nitride (SiCN), silicon oxycarbon nitride (SiOCN), and silicon germanium oxide ($SiGeO_x$).

Referring to FIGS. 1A-1I, FET 100 can be formed on a substrate 104. There can be other FETs and/or structures (e.g., isolation structures) formed on substrate 104. Substrate 104 can be a semiconductor material, such as silicon (Si), germanium (Ge), silicon germanium (SiGe), a silicon-on-insulator (SOI) structure, and a combination thereof. Further, substrate 104 can be doped with p-type dopants, such as boron (B), indium (In), aluminum (Al), and gallium (Ga), or n-type dopants, such as phosphorous (P) and arsenic (As). In some embodiments, fin structures 106 can include a material similar to substrate 104 and extend along an X-axis.

In some embodiments, GAA FET 100 can include nanostructured channel layers (not shown in FIGS. 1A-1I). The nanostructured channel layers can include a semiconductor material, similar to or different from substrate 104. The nanostructured channel layers can include a semiconductor material, similar to fin structures 106 and S/D regions 110. In some embodiments, the nanostructured channel layers can include Si, silicon arsenide (SiAs), silicon phosphide (SiP), silicon carbide (SiC), silicon carbon phosphide (SiCP), SiGe, silicon germanium boron (SiGeB), germanium boron (GeB), silicon germanium stannum boron (SiGeSnB), a III-V semiconductor compound, and other suitable semiconductor materials. The nanostructured channel layers can be nanosheets and nanowires. The nanostructured channel layers can have cross-sections of other geometric shapes, such as circular, elliptical, triangular, and polygonal shapes.

Referring to FIGS. 1A, 1B, 1D, 1F, and 1H, in some embodiments, gate structures 112 can be multi-layered structures. For GAA FET 100, the nanostructured gate regions (not shown in FIGS. 1A-1I) disposed between the nanostructured channel layers (not shown in FIGS. 1A-1I) can also be multi-layered structures. Referring to FIGS. 1B, 1D, 1F, and 1H, each of gate structures 112 and the nanostructured gate regions (not shown in FIGS. 1A-1I) can include an interfacial oxide (IO) layer (not shown in FIGS. 1A-1I), a high-k (HK) gate dielectric layer 138 disposed on the IO layer, and a conductive layer 136 disposed on HK gate dielectric layer 138. The IO layers can include $SiO_x$, $SiGeO_x$, and germanium oxide ($GeO_x$). HK gate dielectric layers 138 can include a HK dielectric material, such as hafnium oxide ($HfO_2$), titanium oxide ($TiO_2$), hafnium zirconium oxide (HfZrO$_2$), tantalum oxide (Ta$_2$O$_3$), hafnium silicate (HfSiO$_4$), zirconium oxide (ZrO$_2$), and zirconium silicate (ZrSiO$_2$). Conductive layers 136 can be multi-layered structures. Each of conductive layers 136 can include a work function metal (WFM) layer disposed on HK gate dielectric layer 138, and a gate metal fill layer on the WFM layer. In some embodiments, the WFM layers can include titanium aluminum (TiAl), titanium aluminum carbide (TiAlC), tantalum aluminum (TaAl), tantalum aluminum carbide (TaAlC), Al-doped titanium (Ti), Al-doped titanium nitride (TiN), Al-doped tantalum (Ta), Al-doped tantalum nitride (TaN), other suitable Al-based materials, and a combination thereof. In some embodiments, the WFM layers can include substantially Al-free (e.g., with no Al) Ti-based and Ta-based nitrides and alloys, such as TiN, titanium silicon nitride (TiSiN), titanium gold (Ti—Au) alloy, titanium copper (Ti—Cu) alloy, TaN, tantalum silicon nitride (TaSiN), tantalum gold (Ta—Au) alloy, tantalum copper (Ta—Cu), and a combination thereof. The gate metal fill layers can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

Referring to FIGS. 1A-1I, for NFET 100, each of S/D regions 110 can include an epitaxially-grown semiconductor material, such as Si and SiGe, and n-type dopants, such as P and other suitable n-type dopants. For PFET 100, each of S/D regions 110 can include an epitaxially-grown semiconductor material, such as Si and SiGe, and p-type dopants, such as B and other suitable p-type dopants. A dopant concentration can be in a range from about $1\times10^{20}$ atoms/cm$^3$ to about $3\times10^2$ atoms/cm$^3$ in each of S/D regions 110. In some embodiments, S/D regions 110 can have a depth of about 50 nm to about 70 nm.

Referring to FIGS. 1B, 1D, 1F, and 1H, FET 100 can include gate contacts 140 disposed on spacers 114 and gate structures 112. Gate contacts 112 can be electrically coupled to gate structures 112. Gate contacts 140 can include lanthanum oxide (La$_2$O$_3$), aluminum oxide (Al$_2$O$_3$), yttrium oxide (Y$_2$O$_3$), tantalum carbon nitride (TaCN), zirconium silicide (ZrSi), SiOCN, silicon oxycarbide (SiOC), SiCN, zirconium nitride (ZrN), zirconium aluminum oxide (ZrAlO), TiO$_2$, Ta$_2$O$_3$, ZrO$_2$, HfO$_2$, SiN, hafnium silicide (HfSi), aluminum oxynitride (AlON), SiO$_x$, SiC, zinc oxide (ZnO), and a combination thereof. Gate contacts 140 are shown with a lower portion and an upper portion. The lower portion can have a height between about 1 nm and about 50 nm. The upper portion can have a height between about 1 nm and about 30 nm. In some embodiments, gate contacts 140 can have the lower portion without the upper portion. In some embodiments, gate contacts 140 can have the upper portion without the lower portion. Gate contacts 140 can have a width between about 2 nm and about 50 nm.

Figure 1B:
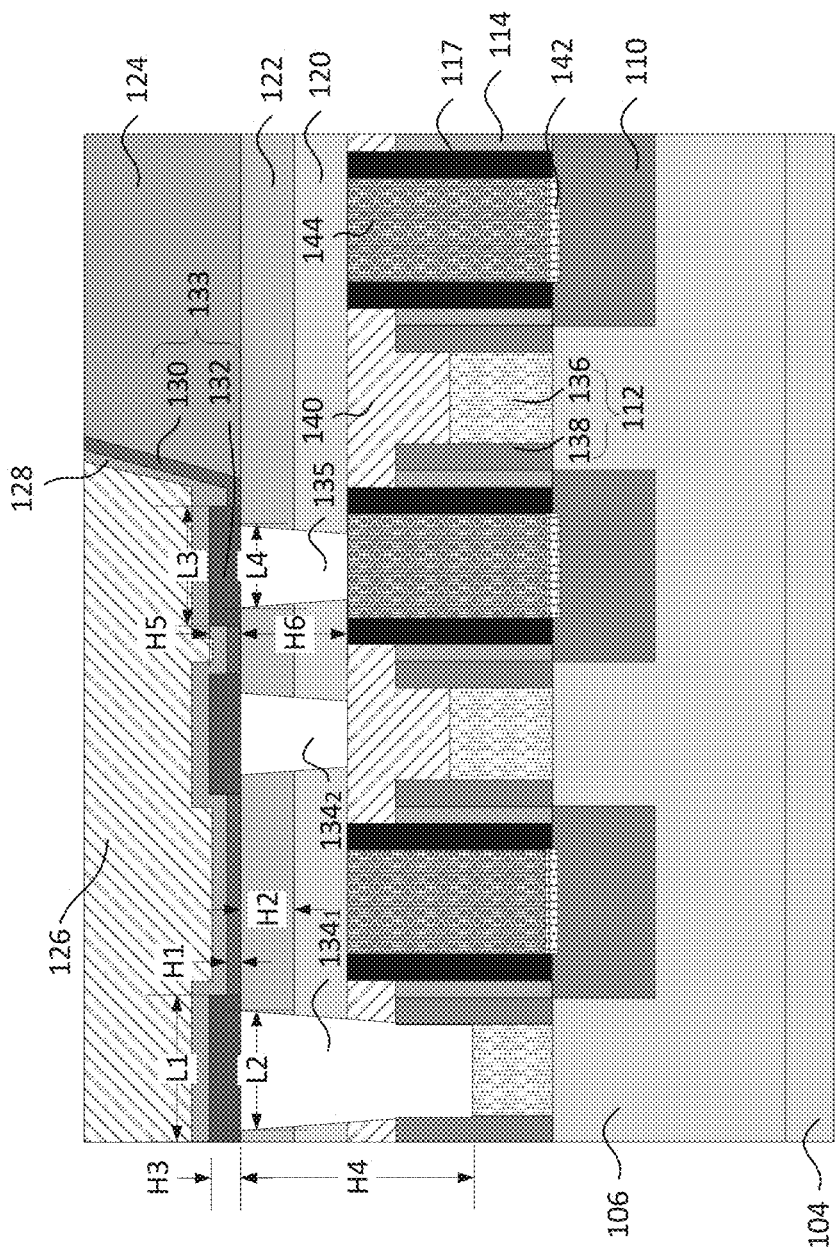
FIGS. 1B-1I illustrate cross-sectional views of a semiconductor device with a nitrided capping layer, according to some embodiments.
Figure 1C:
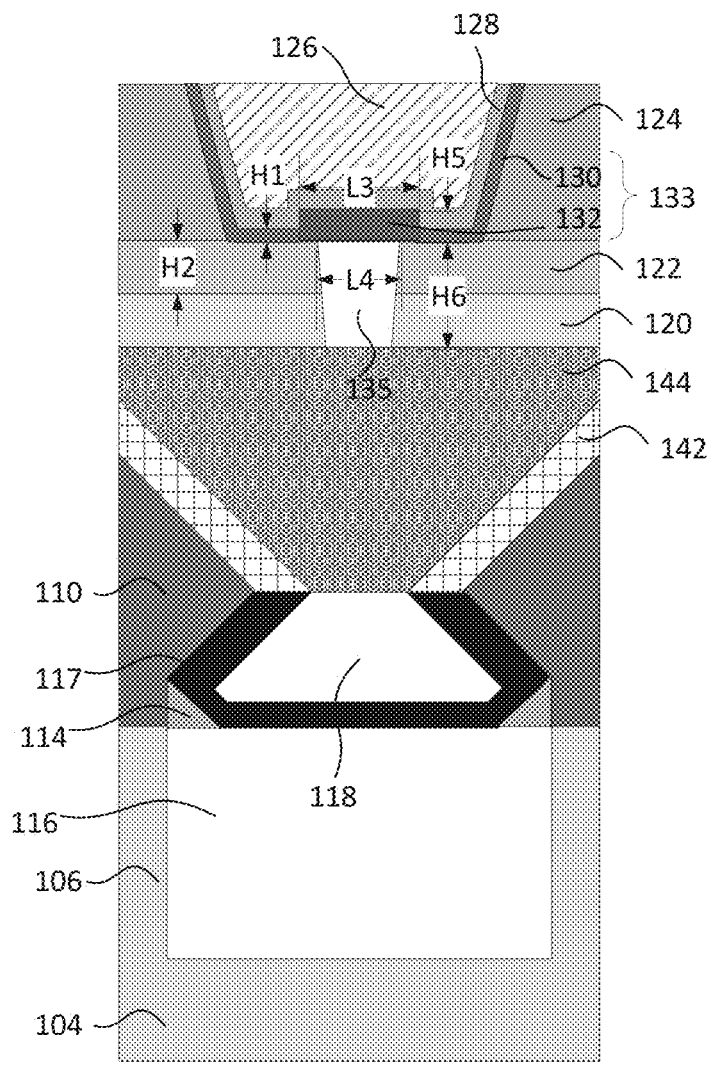
Figure 1D:
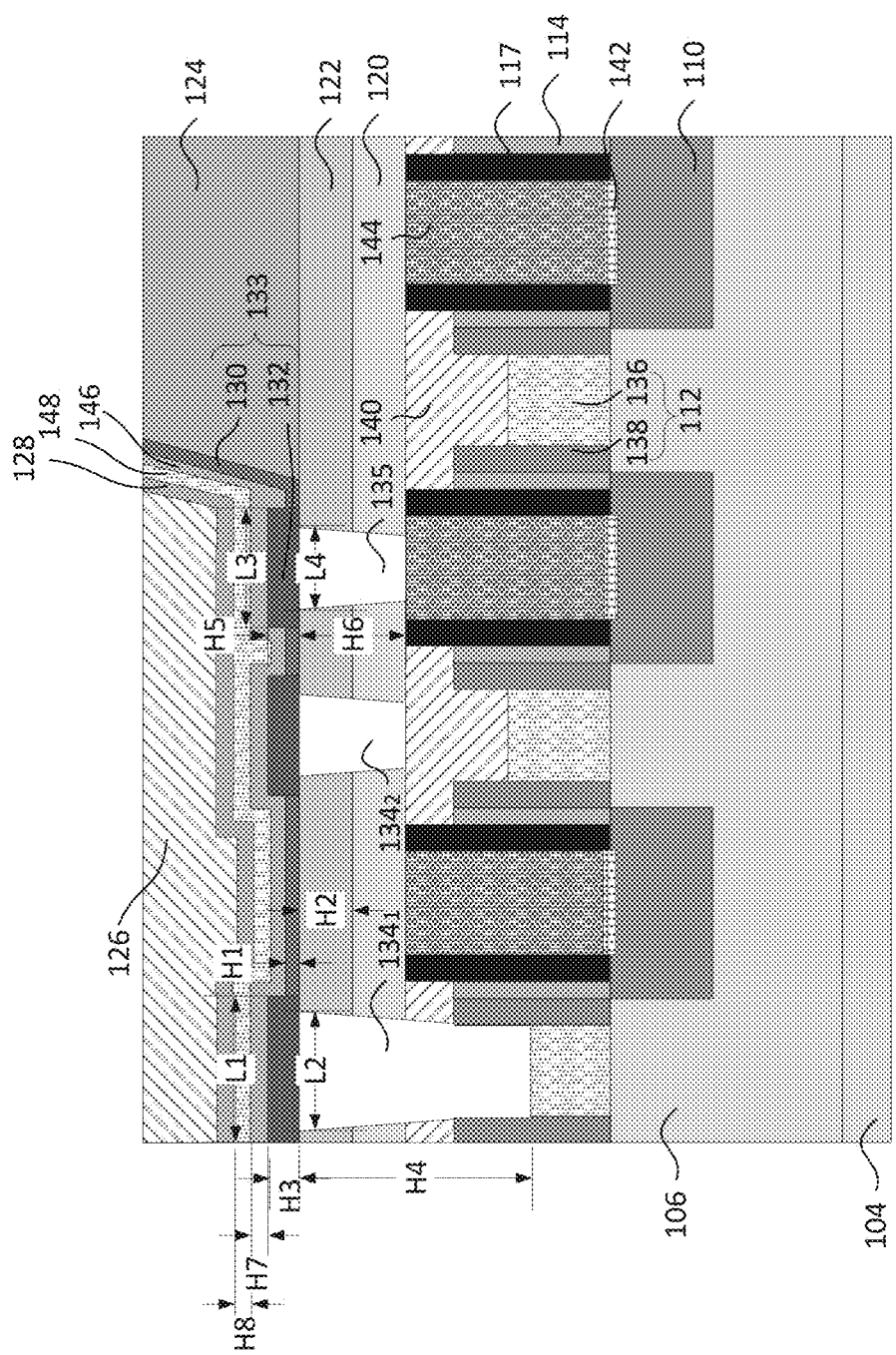
Figure 1E:
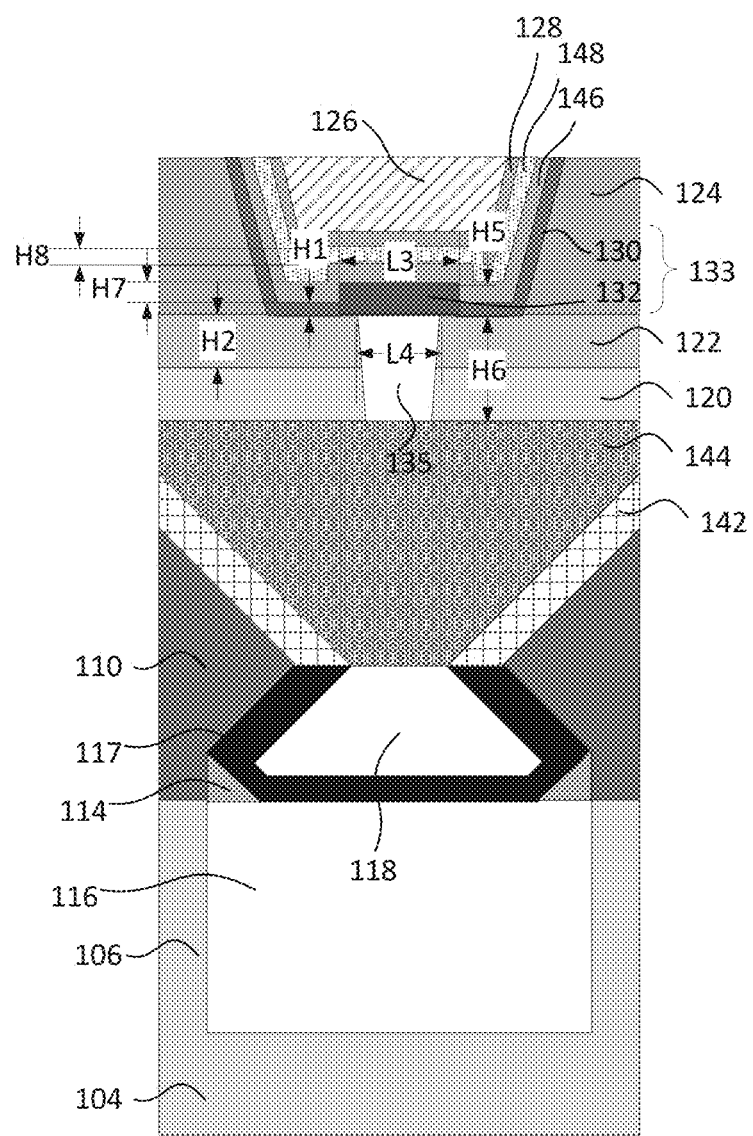
Figure 1E:
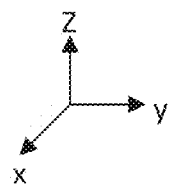
Figure 1F:
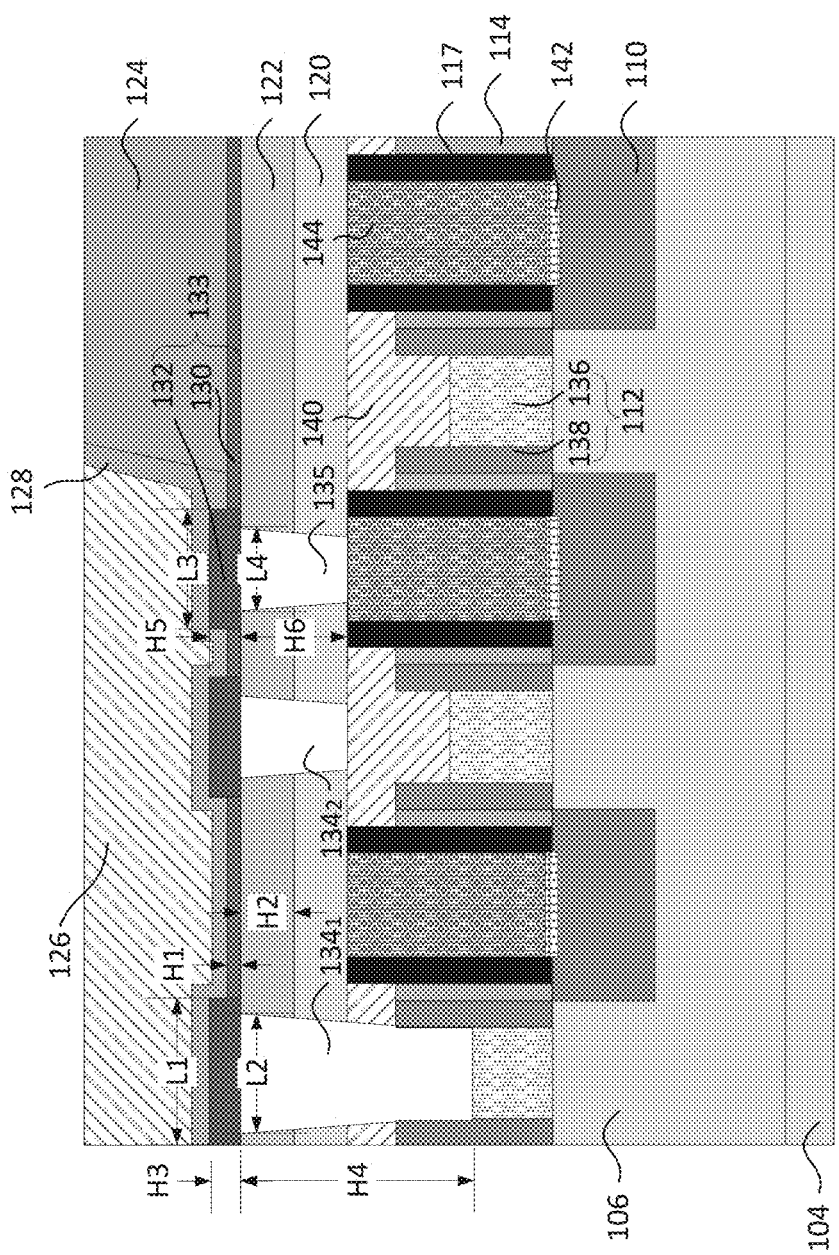
Figure 1F:
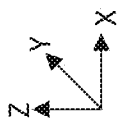
Figure 1G:
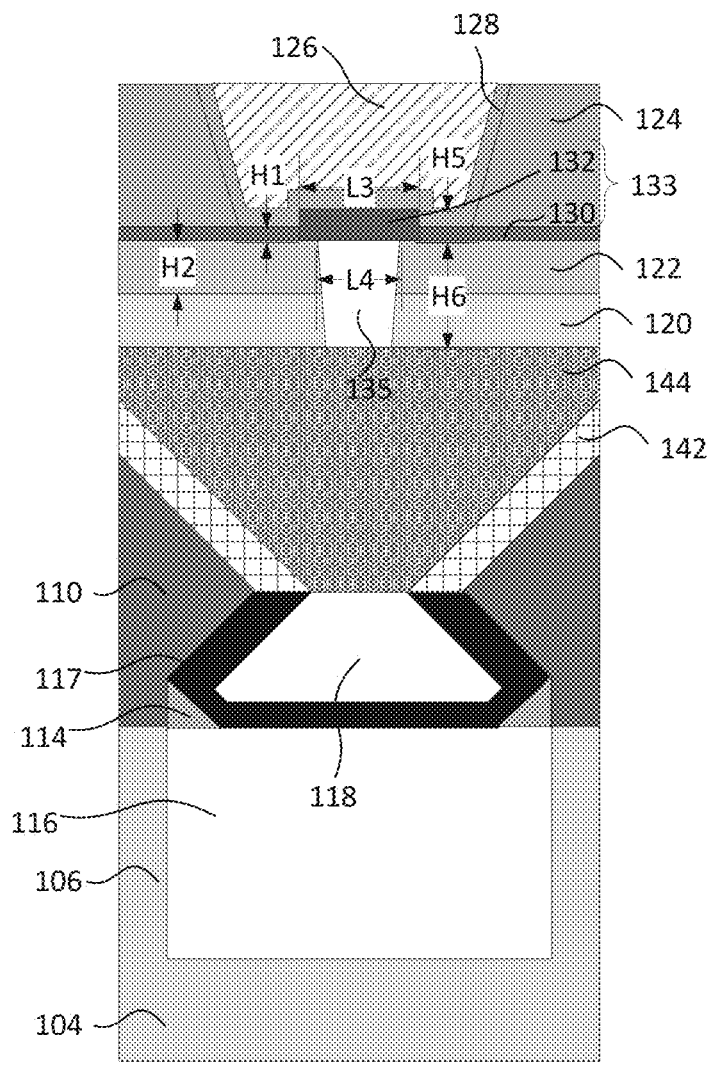
Figure 1H:
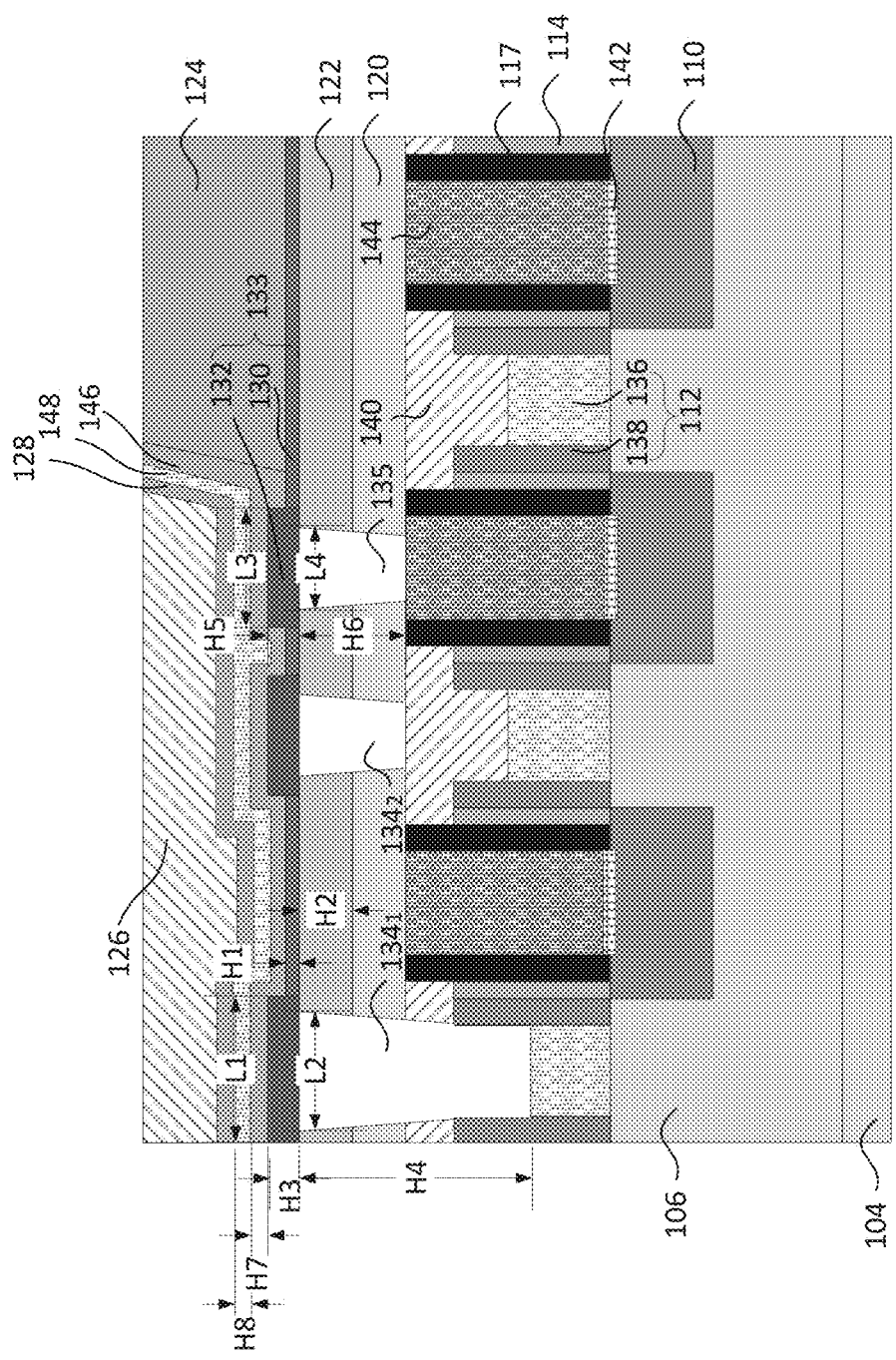
Figure 1I:
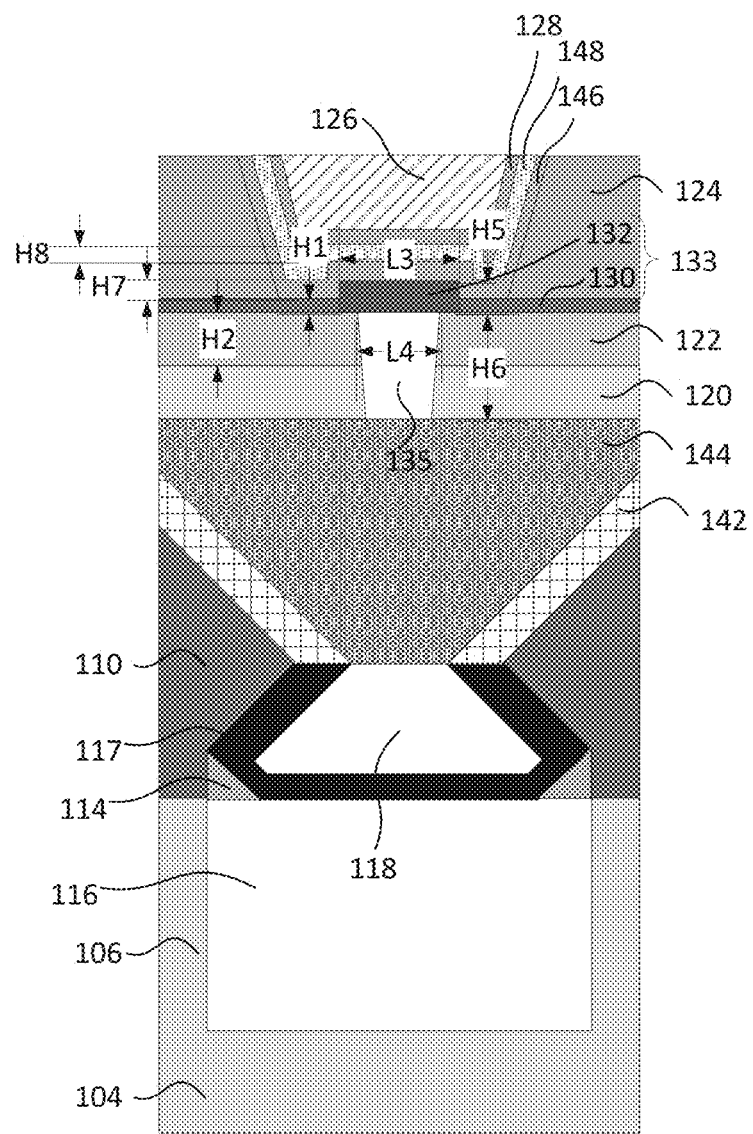
Figure 1I:
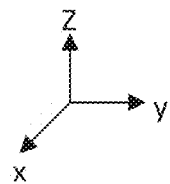

Referring to FIGS. 1B-1$i$, FET 100 can include S/D contacts 144 disposed on S/D regions 110, ESLs 117, and ILD layers 118. In some embodiments, FET 100 can include metal silicide layers 142 disposed between S/D regions 110 and S/D contacts 144. Metal silicide layers 142 can reduce contact resistance between S/D regions 110 and S/D contacts 144. S/D contacts 144 can be electrically coupled to S/D regions 110. S/D contacts 144 can include a suitable conductive material, such as W, Ti, Ru, Mo, Co, Ir, Ni, metal alloys, and a combination thereof. Metal silicide layers 142 can include a corresponding metal silicide MSi$_x$. The metal in MSi$_x$ can be W, Ti, Ru, Mo, Co, Ir, Ni, metal alloys, and a combination thereof.

Referring to FIGS. 1A-1I, FET 100 can include inter-metal dielectric (IMD) layers. The IMD layers can include metal via dielectric layers 120 and 122 and metal line dielectric layer 124. Metal via dielectric layer 120 can be disposed on gate contacts 140 and S/D contacts 144. Metal via dielectric layer 122 can be disposed on metal via dielectric layer 120. In some embodiments, FET 100 can include one metal via dielectric layer. Metal line dielectric layer 124 can be disposed on metal via dielectric layer 122. Metal via dielectric layers 120 and 122 and metal line dielectric layer 124 can include La$_2$O$_3$, Al$_2$O$_3$, Y$_2$O$_3$, TaCN, ZrSi, SiOCN, SiOC, SiCN, ZrN, ZrAlO, TiO$_2$, Ta$_2$O$_3$, ZrO$_2$, HfO$_2$, SiN, HfSi, AlON, SiO$_x$, SiC, ZnO, and a combination thereof. Metal via dielectric layers 120 and 122 and metal line dielectric layer 124 can each have a thickness between about 2 nm and about 20 nm.

Referring to FIGS. 1B, 1D, 1F, and 1H, FET 100 can include gate metal vias 134$_1$ and 134$_2$. In some embodiments, the gate metal vias, such as gate metal via 134$_1$, can be disposed through metal via dielectric layers 120 and 122 and on conductive layers 136 of gate structures 112. In some embodiments, the gate metal vias, such as gate metal via 134$_2$, can be disposed through metal via dielectric layers 120 and 122 and on gate contacts 140. Gate metal vias 134$_1$ and 134$_2$ can be electrically coupled to gate contacts 140 and conductive layers 136 of gate structures 112. Referring to FIGS. 1B-1I, FET 100 can include a S/D metal via 135. S/D metal via 135 can be disposed through metal via dielectric layers 120 and 122 and on S/D contacts 144. S/D metal via 135 can be electrically coupled to S/D contacts 144. In some embodiments, there can be a glue layer, such as a seed metal layer, disposed between metal via dielectric layers 120 and 122 and metal vias 134$_1$, 134$_2$ and 135. Gate metal vias 134$_1$ and 134$_2$ and S/D metal via 135 can include a suitable conductive material, such as W, Ti, Ru, Mo, Co, Cu, TiN, metal alloys, and a combination thereof.

Referring to FIGS. 1B-1I, FET 100 can include a nitrided capping layer 133. Nitrided capping layer 133 can include a nitrided metal layer 132 and a nitrided dielectric layer 130. Nitrided metal layer 132 can be disposed on gate metal vias 134$_1$ and 134$_2$ and S/D metal via 135. Nitrided metal layer 132 can include tungsten nitride (W$_x$N$_y$), ruthenium nitride (Ru$_x$N$_y$), cobalt nitride (Co$_x$N$_y$), molybdenum nitride (Mo$_x$N$_y$), TiN, copper nitride (Cu$_x$N$_y$), and a combination thereof. Referring to FIGS. 1B-1E, nitrided dielectric layer 130 can be disposed on metal via dielectric layer 122 and on sidewalls of metal line dielectric layer 124. Referring to FIGS. 1F-1I, nitrided dielectric layer 130 can be disposed on metal via dielectric layer 122. Nitrided dielectric layer 130 can include SiN, SiOCN, SiCN, AlON, SiON, and a combination thereof. In some embodiments, oxygen (O) atoms in the top portion of metal via dielectric layer 122 and metal line dielectric layer 124 can be replaced with nitrogen (N) atoms during the formation of nitrided dielectric layer 130. Compared to metal via dielectric layer 122 and metal line dielectric layer 124, a concentration of N atoms in nitrided dielectric layer 130 can increase between about 1% and about 5%, and a concentration of O atoms in nitrided dielectric layer 130 can decrease between about 1% and about 5%. A concentration of N atoms in nitrided capping layer 133 can be between about $1\times10^{17}$ atoms/cm$^3$ and about $1\times10^{22}$ atoms/cm$^3$, between about $0.8\times10^{17}$ atoms/cm$^3$ and about $1.2\times10^{22}$ atoms/cm$^3$, and between about $0.5\times10^{17}$ atoms/cm$^3$ and about $1.5\times10^{22}$ atoms/cm$^3$. If the concentration of N atoms is less than about $0.5\times10^{17}$ atoms/cm$^3$, nitrided capping layer 133 cannot prevent the electromigration from metal line 126 to metal vias 134$j$, 134$_2$, and 135.

If the concentration of N atoms is greater than about $1.5 \times 10^{22}$ atoms/cm$^3$, the resistance between metal line 126 and metal vias 134$_1$, 134$_2$, and 135 can be too high. The concentration of N atoms in nitrided capping layer 133 can vary with respect to depth. In some embodiments, the concentration can decrease from the top surface of nitrided capping layer 133 to the bottom surface of nitrided capping layer 133. The concentration of N atoms in nitrided capping layer 133 can decrease exponentially from the top surface of nitrided capping layer 133 to the bottom surface of nitrided capping layer 133. In some embodiments, the concentration can increase first and then decrease from the top surface of nitrided capping layer 133 to the bottom surface of nitrided capping layer 133. The conductivity of nitrided metal layer 132 can be between about $1 \times 10^3$/Ohm·cm and about $1 \times 10^6$/Ohm·cm, between about $0.8 \times 10^3$/Ohm·cm and about $1.2 \times 10^6$/Ohm·cm, and between about $0.5 \times 10^3$/Ohm·cm and about $1.5 \times 10^6$/Ohm·cm. If the conductivity is greater than about $1.5 \times 10^6$/Ohm·cm, nitrided capping layer 133 cannot prevent the electromigration from metal line 126 to metal vias 134$_1$, 134$_2$, and 135. If the conductivity is less than about $0.5 \times 10^3$/Ohm·cm, the resistance between metal line 126 and metal vias 134$_1$, 134$_2$, and 135 can be too high.

Referring to FIGS. 1B-1I, a length L2 of a top portion of gate metal via 134$_1$ and a length L4 of a top portion of S/D metal via 135 can be between about 2 nm and about 50 nm. A length L1 and a length L3 of nitrided metal layer 132 can be between about 3 nm and about 55 nm. A ratio L1/L2 and L3/L4 can be between about 1.1 and about 1.5, between about 1.05 and about 1.6, and between about 1.02 and about 1.7. If the ratio L1/L2 and L3/L4 is less than about 1.02, nitrided capping layer 133 cannot prevent the electromigration from metal line 126 to metal vias 134$_1$, 134$_2$, and 135. If the ratio L1/L2 and L3/L4 is greater than about 1.7, the resistance between metal line 126 and metal vias 134$_1$, 134$_2$, and 135 can be too high. A height H4 of gate metal via 134$_1$ can be between about 2 nm and about 80 nm. A height H6 of S/D metal via 135 can be between about 2 nm and about 50 nm. A height H3 and a height H5 of nitrided metal layer 132 can be between about 0.5 nm and about 10 nm. A ratio H3/H4 and H5/H6 can be between about 0.02 and about 0.08, between about 0.015 and about 0.09, and between about 0.01 and about 0.1. If the ratio H3/H4 and H5/H6 is less than about 0.01, nitrided capping layer 133 cannot prevent the electromigration from metal line 126 to metal vias 134$_1$, 134$_2$, and 135. If the ratio H3/H4 and H5/H6 is greater than about 0.1, the resistance between metal line 126 and metal vias 134$_1$, 134$_2$, and 135 can be too high. A height H2 of metal via dielectric layer 122 can be between about 2 nm and about 20 nm. A height H1 of nitrided dielectric layer 130 can be between about 0.5 nm and about 4 nm. A ratio H1/H2 can be between about 0.02 and about 0.08, between about 0.015 and about 0.09, and between about 0.01 and about 0.1. If the ratio H1/H2 is less than about 0.01, nitrided capping layer 133 cannot prevent the electromigration from metal line 126 to metal vias 134$_1$, 134$_2$, and 135. If the ratio H1/H2 is greater than about 0.1, the resistance between metal line 126 and metal vias 134$_1$, 134$_2$, and 135 can be too high.

Referring to FIGS. 1A-1I, FET 100 can include a metal line 126. Metal line 126 is electrically coupled to metal vias 134$_1$, 134$_2$, and 135. Metal line 126 can include a suitable conductive metal, such as Co, Cu, and a combination thereof. A height of metal line 126 can be between about 2 nm and about 20 nm. Referring to FIGS. 1B-1I, in some embodiments, FET 100 can include a seed metal layer 128. Seed metal layer 128 can include a suitable conductive metal, such as Co, Ru, W, Mo, and a combination thereof. A height of seed metal layer 128 can be between about 0.5 nm and about 10 nm. Seed metal layer 128 can improve adhesion for metal line 126. Because nitrided capping layer 133 can reduce (or prevent) electromigration from metal line 126 to metal vias 134$_1$, 134$_2$, and 135, barrier layers between metal line 126 and metal vias 134$_1$, 134$_2$, and 135 can be eliminated or have reduced thicknesses (e.g., thickness reduced by about 20% to about 80%). Referring to FIGS. 1B, 1C, 1F, and 1G, barrier layers are eliminated. Referring to FIGS. 1D, 1E, 1H, and 1I, barrier layers with reduced thicknesses (e.g., thickness reduced by about 20% to about 80%) can be used. FET 100 can include barrier layers 146 and 148. Barrier layer 146 can include TiN, TaN, and a combination thereof. Barrier layer 148 can include Co, Ru, W, Mo, and a combination thereof. Each of barrier layers 146 and 148 can be between about 0.5 nm and about 10 nm. In some embodiments, barrier layer 146 can be formed without barrier layer 148. In some embodiments, barrier layer 148 can be formed without barrier layer 146. Since barrier layers 146 and 148 are either reduced or eliminated and nitrided capping layer 133 has a lower resistance than barrier layers 146 and 148, the resistance and the signal delay (e.g., RC delay) in the interconnect structures can be reduced. Overall performance and yield of the IC can be enhanced.

Figure 2:
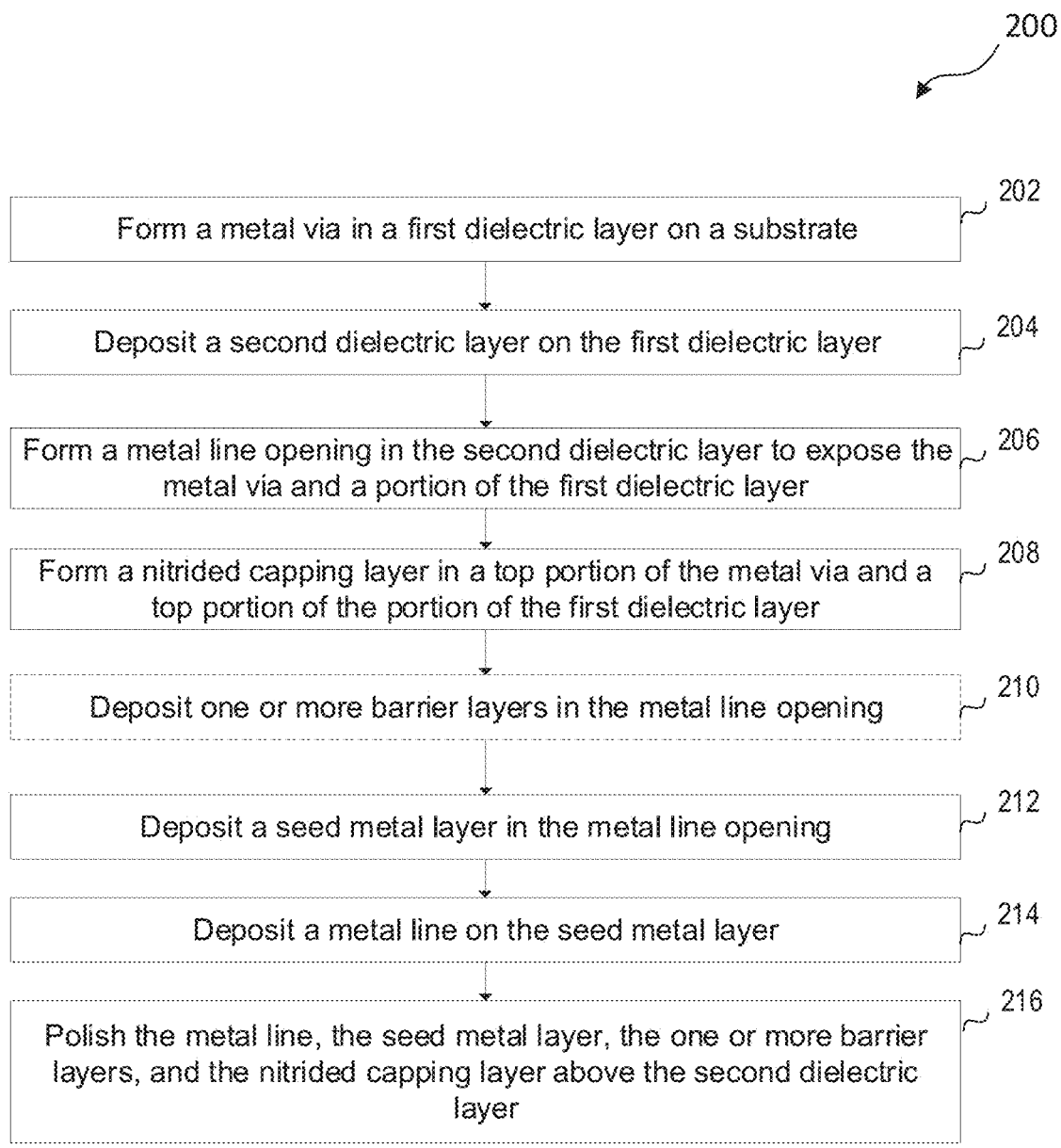
FIG. 2 is a flow diagram of a method for fabricating a semiconductor device with a nitrided capping layer, according to some embodiments.

According to some embodiments, FIG. 2 is a flow diagram describing a method 200 for fabricating FET 100, as shown in FIGS. 1A-1I. For illustrative purposes, the operations illustrated in FIG. 2 will be described with reference to the example fabrication process for fabricating FET 100 as illustrated in FIGS. 3-10. FIGS. 3-6A and 7-10 are cross-sectional views of FET 100 at various stages of fabrication, according to some embodiments. Additional fabrication operations can be performed between the various operations of method 200 and are omitted for simplicity. These additional fabrication operations are within the spirit and the scope of this disclosure. Moreover, not all operations may be required to perform the disclosure provided herein. Additionally, some of the operations can be performed simultaneously or in a different order than the ones shown in FIG. 2. It should be noted that method 200 may not produce a complete FET 100. Accordingly, it is understood that additional processes can be provided before, during, and after method 200, and that some other processes may only be briefly described herein. Elements in FIGS. 3-6A and 7-10 with the same annotations as elements in FIGS. 1A-1I are described above.

Figure 3:
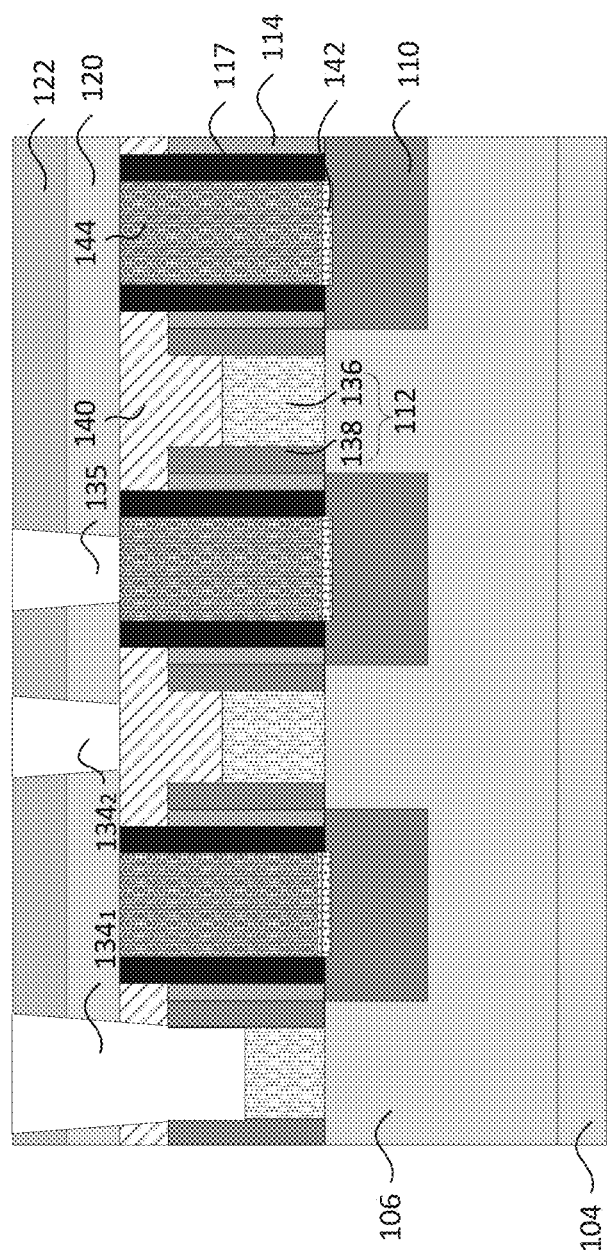
FIGS. 3-10 illustrate cross-sectional views of a semiconductor device with a nitrided capping layer at various stages of its fabrication process, according to some embodiments.

Referring to FIG. 2, in operation 202, a metal via can be formed in a metal via dielectric layer disposed on a substrate. The substrate can include transistor structures. For example, as shown in FIG. 3, gate metal vias 134$_1$ and 134$_2$ and S/D metal via 135 are formed in metal via dielectric layers 120 and 122. Metal via dielectric layers 120 and 122 can be deposited on gate contacts 140 and S/D contacts 144 using a chemical vapor deposition (CVD) process, a plasma-enhanced chemical vapor deposition (PECVD) process, and a physical vapor deposition (PVD) process. Metal via openings (not shown in FIG. 3) can be formed by patterned photoresist (not shown in FIG. 3) and an etching process. A photoresist layer (not shown in FIG. 3) can be patterned so that patterned photoresist structures are formed over metal via dielectric layer 122. Patterning of the photoresist layer can be accomplished by exposing the photoresist layer to ultraviolet (UV) and extreme ultraviolet (EUV) light through a reticle (e.g., a photomask) and subsequently removing unexposed (or exposed portions) of the photoresist layer. The etching process can include a dry etch process and a wet etch process. The dry etch process (e.g., reactive ion etching process) can use a gas mixture having fluorocarbon ($C_xF_y$), nitrogen, and argon. The gas mixture can have about 10% to about 70% $C_xF_y$. The wet etch process can include a diluted solution of hydrofluoric acid (HF) with a buffer, such as ammonium fluoride ($NH_4F$), diluted HF ($HF/H_2O$), phosphoric acid ($H_3PO_4$), sulfuric acid with deionized water ($H_2SO_4/H_2O$), and any combinations thereof. The etching process can be a selective etch and a timed etch such that the desired dimensions (e.g., width and height) of the metal via openings can be formed. The metal via openings can be filled with a conductive material to form gate metal vias $134_1$ and $134_2$ and S/D metal via 135. The conductive material can be deposited in the metal via openings by a sputtering process, a PVD process, a CVD process, a PECVD process, a metal-organic chemical vapor deposition (MOCVD) process, and an electroplating process. In some embodiments, a seed metal layer can be deposited in the metal via openings before the conductive material can be deposited. In some embodiments, a chemical mechanical polishing (CMP) process can follow such that gate metal vias $134_1$ and $134_2$ and S/D metal via 135 can be substantially coplanar with metal via dielectric layer 122.

Figure 4:
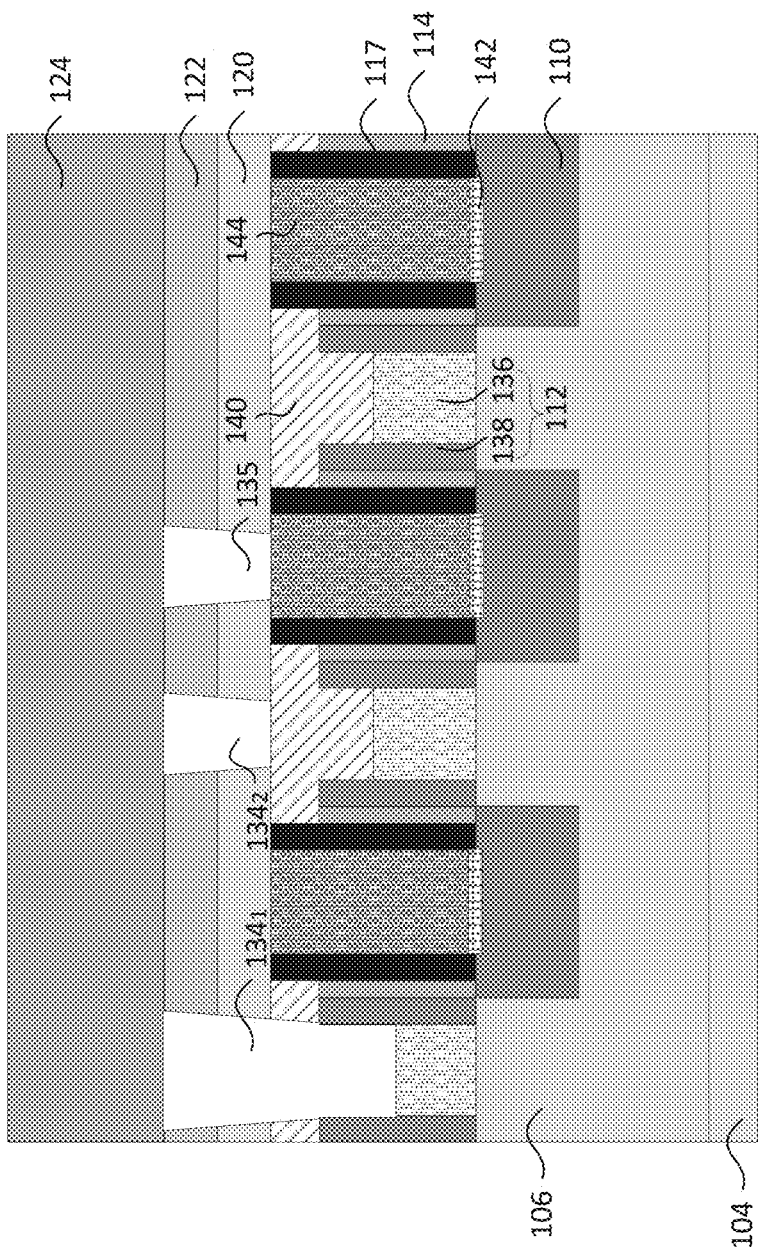

Referring to FIG. 2, in operation 204, a metal line dielectric layer can be deposited on the metal via dielectric layers. For example, as shown in FIG. 4, a metal line dielectric layer 124 is deposited on metal via dielectric layer 122. Metal line dielectric layer 124 can be deposited on metal via dielectric layer 122 using a CVD process, a PECVD process, and a PVD process.

Figure 5:
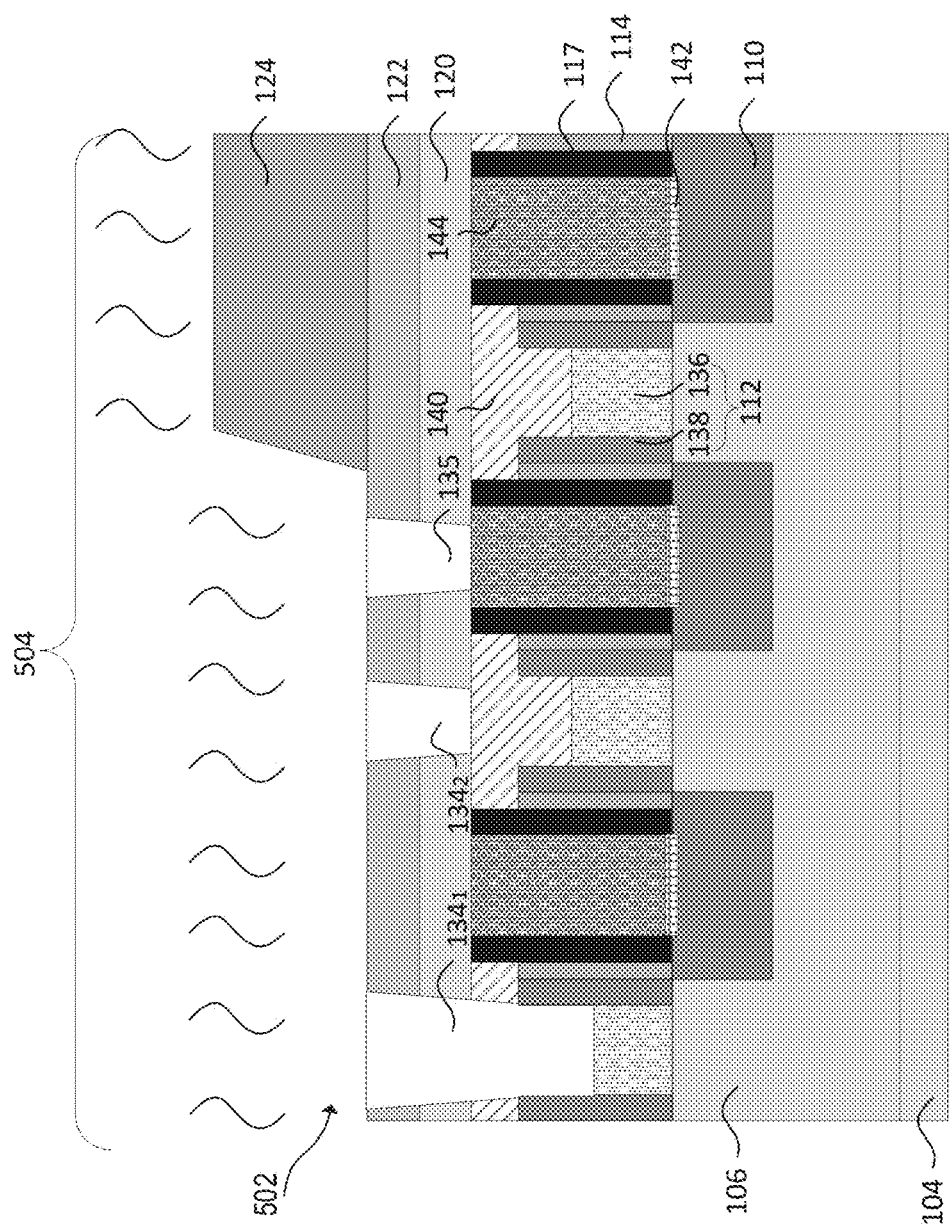

Referring to FIG. 2, in operation 206, a metal line opening can be formed in the metal line dielectric layer to expose the metal vias and portions of the metal via dielectric layer. For example, as shown in FIG. 5, a metal line opening 502 is formed in metal line dielectric layer 124 to expose gate metal vias $134_1$ and $134_2$ and S/D metal via 135 and portions of metal via dielectric layer 122. Metal line opening 502 can be formed by patterned photoresist (not shown in FIG. 5) and an etching process. A photoresist layer (not shown in FIG. 5) can be patterned so that patterned photoresist structures are formed over metal line dielectric layer 124. Patterning of the photoresist layer can be accomplished by exposing the photoresist layer to UV and EUV light through a reticle (e.g., a photomask) and subsequently removing unexposed (or exposed portions) of the photoresist layer. The etching process can include a dry etch process and a wet etch process. The dry etch process (e.g., reactive ion etching process) can use a gas mixture having $C_xF_y$, nitrogen, and argon. The gas mixture can have about 10% to about 70% $C_xF_y$. The wet etch process can include a diluted solution of HF with a buffer, such as $NH_4F$, $HF/H_2O$, $H_3PO_4$, $H_2SO_4/H_2O$, and any combinations thereof. The etching process can be a selective etch and a timed etch such that the desired dimensions (e.g., width and height) of metal line opening 502 can be formed.

Figure 6A:
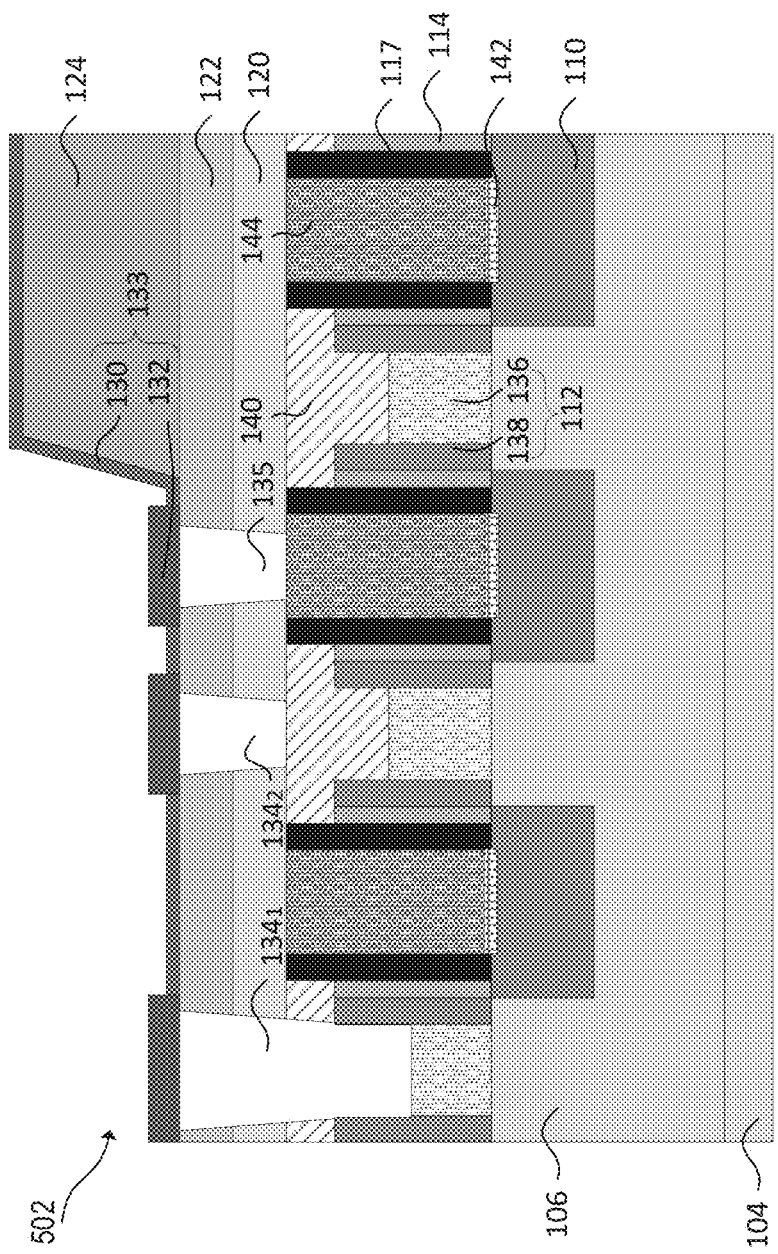
Figure 6A:
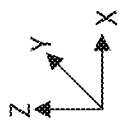

Referring to FIG. 2, in operation 208, a nitrided capping layer can be formed in a top portion of the metal vias and a top portion of the portions of the exposed metal via dielectric layer. For example, as shown in FIG. 6A, a nitrided capping layer 133 is formed. Nitrided capping layer 133 can include a nitrided metal layer 132 formed in a top portion of gate metal vias $134_1$ and $134_2$ and S/D metal via 135. Nitrided capping layer 133 can include a nitrided dielectric layer 130 formed in a top portion of the exposed portions of metal via dielectric layer 122 and sidewall portions of metal line dielectric layer 124.

There can be two processes for forming nitrided capping layer 133. The first process can be a nitridation treatment process. Referring to FIG. 5, nitridation precursor gases 504 can include ammonia ($NH_3$), a gas mixture of ammonia and hydrogen ($NH_3/H_2$), a gas mixture of nitrogen and hydrogen ($N_2/H_2$), and combinations thereof. The pressure in the nitridation chamber can be between about 0.05 Torr and about 10 Torr, between about 0.04 Torr and about 12 Torr, and between about 0.03 Torr and about 15 Torr. If the pressure is less than about 0.03 Torr, nitrided capping layer 133 cannot prevent the electromigration from metal line 126 to metal vias $134_1$, $134_2$, and 135. If the pressure is greater than about 15 Torr, the resistance between metal line 126 and metal vias $134_1$, $134_2$, and 135 can be too high. The radiofrequency (RF) power supplied to the nitridation chamber can be between about 30 W and about 1000 W, between about 20 W and about 1100 W, and between about 10 W and about 1200 W. If the RF power is less than about 10 W, nitrided capping layer 133 cannot prevent the electromigration from metal line 126 to metal vias $134_1$, $134_2$, and 135. If the RF power is greater than about 1200 W, the resistance between metal line 126 and metal vias $134j$, $134_2$, and 135 can be too high. The gas flow rate for nitridation precursor gases 504 can be between about 5 sccm and about 1000 sccm, between about 4 sccm and about 1100 sccm, and between about 3 sccm and about 1200 sccm. If the gas flow rate is less than about 3 sccm, nitrided capping layer 133 cannot prevent the electromigration from metal line 126 to metal vias $134_1$, $134_2$, and 135. If the gas flow rate is greater than about 1200 sccm, the resistance between metal line 126 and metal vias $134_1$, $134_2$, and 135 can be too high.

The second process can be a nitrogen ($N_2$) ion implantation process. Referring to FIG. 5, $N_2$ ion implantation dopant 504 can include $N_2$. The ion beam energy can be between about 0.5 keV and about 1 keV, between about 0.3 keV and about 1.3 keV, and between about 0.1 keV and about 1.5 keV. If the ion beam energy is less than about 0.1 keV, nitrided capping layer 133 cannot prevent the electromigration from metal line 126 to metal vias $134_1$, $134_2$, and 135. If the ion beam energy is greater than about 1.5 keV, the resistance between metal line 126 and metal vias $134_1$, $134_2$, and 135 can be too high and there can too many defects formed in metal vias $134_1$, $134_2$, and 135. The ion implantation dose can be between about $1 \times 10^{15}$ atoms/$cm^2$ and about $1 \times 10^{17}$ atoms/$cm^2$, between about $0.8 \times 10^{17}$ atoms/$cm^2$ and about $1.2 \times 10^{17}$ atoms/$cm^2$, and between about $0.5 \times 10^{15}$ atoms/$cm^2$ and about $1.5 \times 10^{17}$ atoms/$cm^2$. If the ion implantation dose is less than about $0.5 \times 10^{15}$ atoms/$cm^2$, nitrided capping layer 133 cannot prevent the electromigration from metal line 126 to metal vias $134_1$, $134_2$, and 135. If the ion implantation dose is greater than about $1.5 \times 10^{1\prime}$ atoms/$cm^2$, the resistance between metal line 126 and metal vias $134_1$, $134_2$, and 135 can be too high. The tilt angle of the $N_2$ ion implantation can be about 0 degrees.

Referring to FIG. 6B, the concentration of the nitrogen atoms in nitrided capping layer 133 can initially increase with depth and then decrease. For the $N_2$ ion implantation process, the most concentrated point with respect to depth can be shallower with lower ion beam energy and can be deeper with higher ion beam energy. The concentration of the nitrogen atoms implanted at the most concentrated point can be greater with lower ion beam energy and smaller with higher ion beam energy. The entire depth of implantation can be smaller with lower ion beam energy and greater with higher ion beam energy. In some embodiments, the concentration of the nitrogen atoms in nitrided capping layer 133 can decrease with depth from the top surface of nitrided capping layer 133. The variation of the concentration of the nitrogen atoms in nitrided capping layer 133 with respect to depth can have a similar trend in nitrided metal layer 132 and nitrided dielectric layer 130. In some embodiments, the nitridation treatment process and the $N_2$ ion implantation process can cause a volume increase in the top portion of gate metal vias $134_1$ and $134_2$ and S/D metal via 135 between about 10% and about 60%. In some embodiments, the nitridation treatment process and the $N_2$ ion implantation process can cause a negligible volume change in the top portion of the exposed portions of metal via dielectric layer 122 and sidewall portions of metal line dielectric layer 124.

Figure 7:
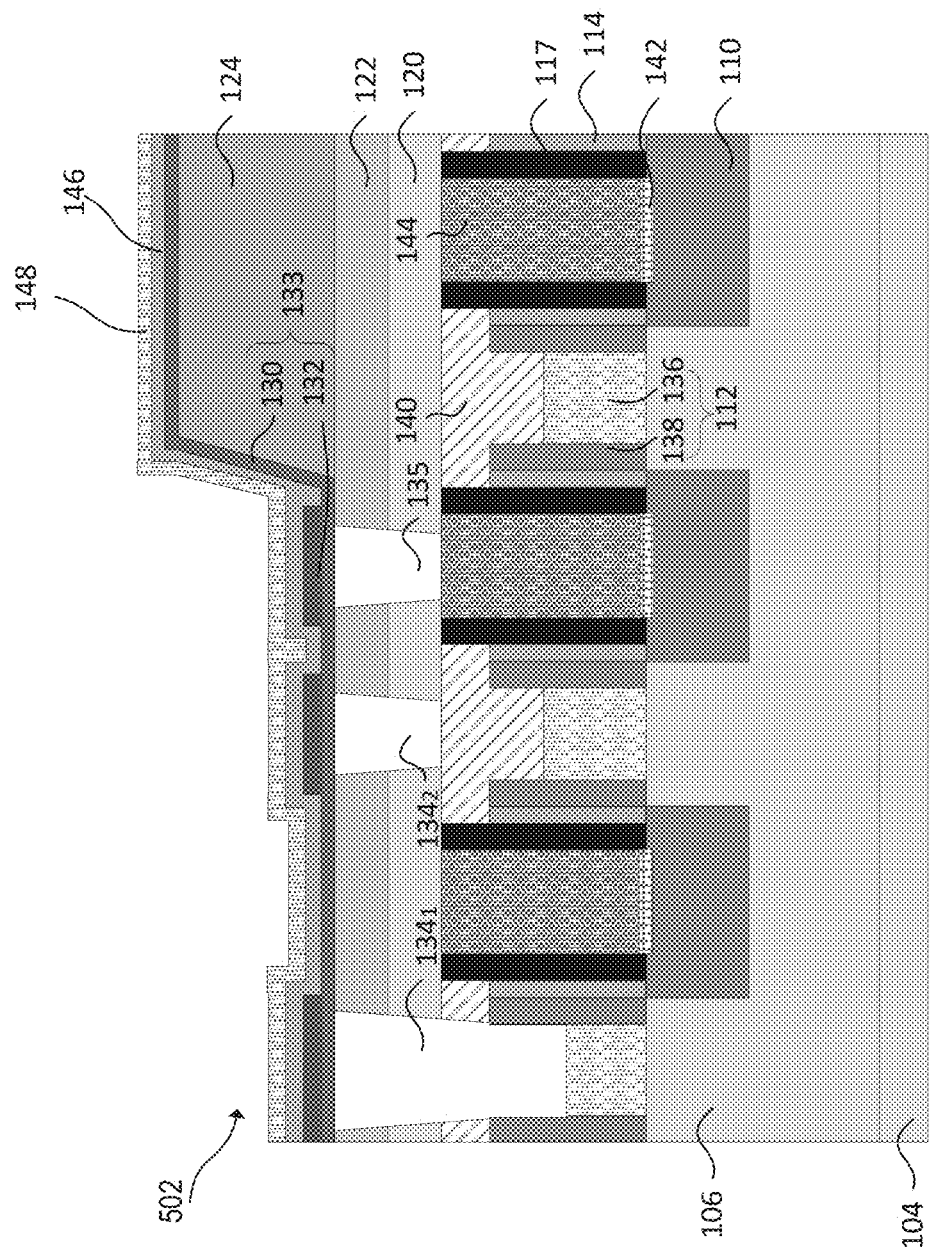

Referring to FIG. 2, in operation 210, one or more barrier layers can be deposited in the metal line opening. For example, as shown in FIG. 7, barrier layers 146 and 148 are deposited in metal line opening 502. In some embodiments, barrier layers 146 and 148 can be deposited by thermal and plasma atomic layer deposition (ALD) processes. Alternative deposition processes, such as a PECVD process and a CVD process, can be used. In some embodiments, barrier layer 146 can be deposited without barrier layer 148. In some embodiments, barrier layer 148 can be deposited without barrier layer 146. In some embodiments, neither barrier layer 146 nor barrier layer 148 is deposited.

Figure 8:
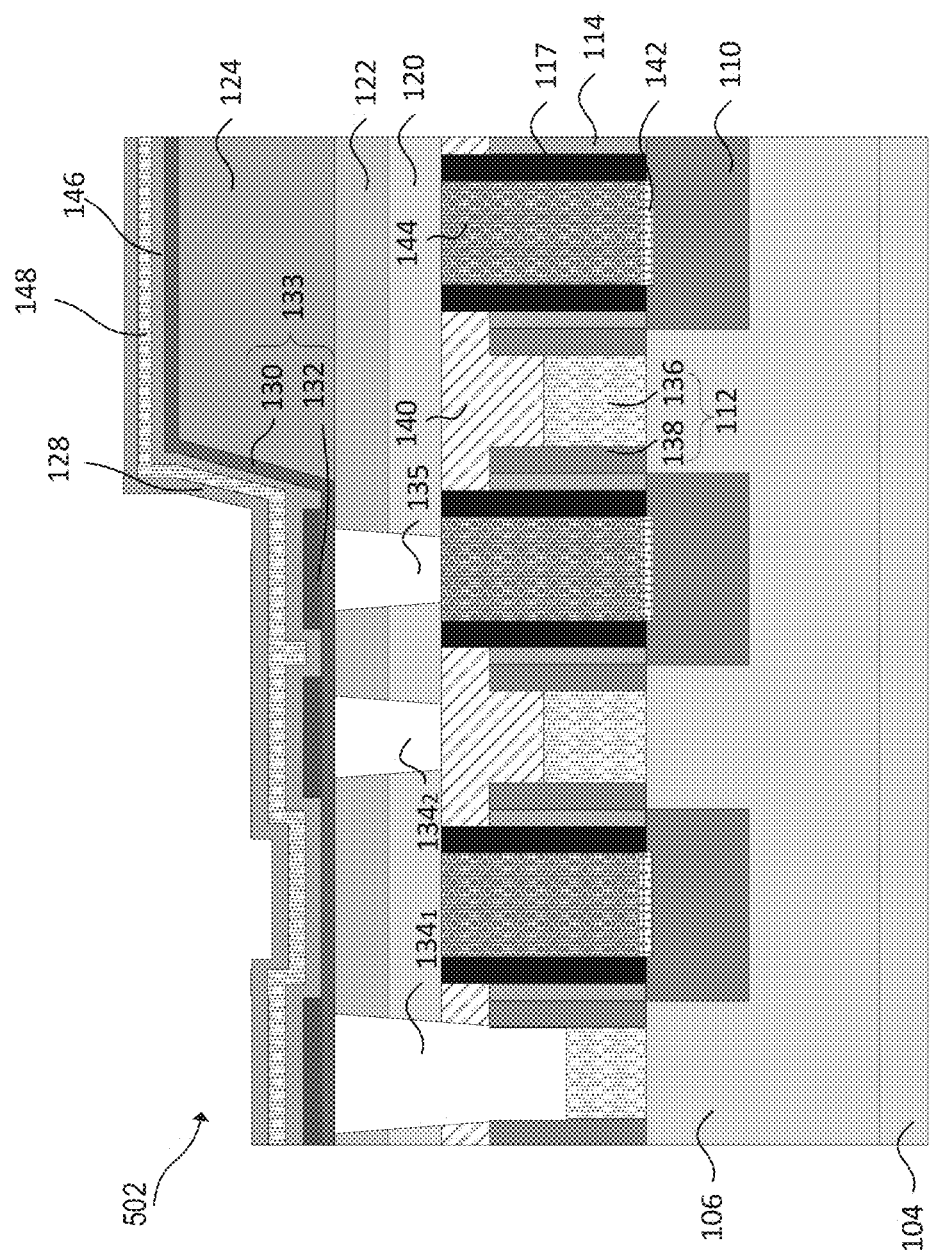

Referring to FIG. 2, in operation 212, a seed metal layer can be deposited in the metal line opening. For example, as shown in FIG. 8, a seed metal layer 128 is deposited in metal line opening 502. In some embodiments, seed metal layer 128 can be deposited on barrier layers 146 and 148. Seed metal layer 128 can be deposited by an ALD process, a PECVD process, and a CVD process. Seed metal layer 128 can be used to improve adhesion and metal filling quality. In some embodiments, seed metal layer 128 can be omitted.

Figure 9:
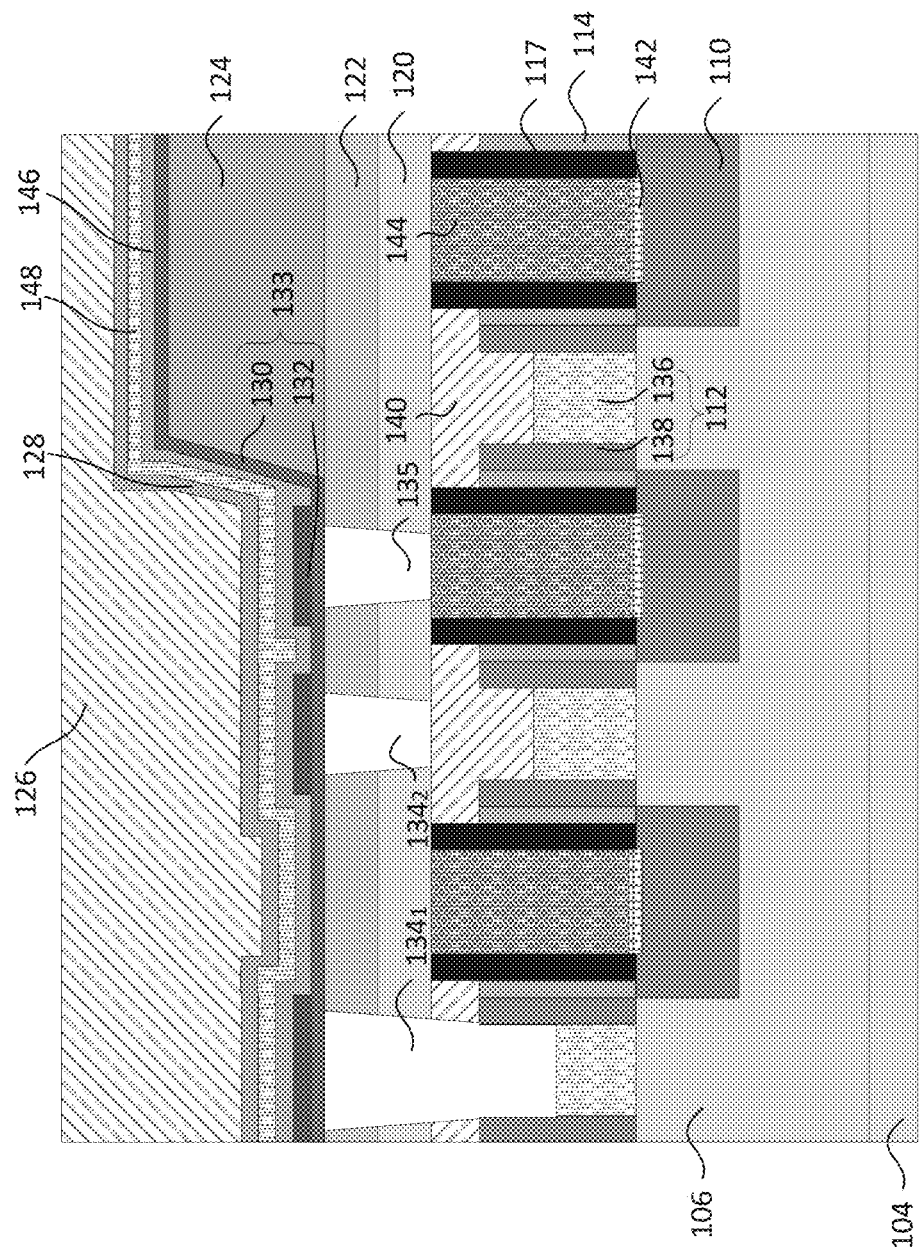

Referring to FIG. 2, in operation 214, a metal line can be deposited on the seed metal layer. For example, as shown in FIG. 9, a metal line 126 is deposited on seed metal layer 128. In some embodiments, metal line 126 can be deposited in metal line opening 502 and on seed metal layer 128 by a sputtering process, a PVD process, a CVD process, a PECVD process, a MOCVD process, or an electroplating process. Other fabrication techniques for metal line 126 are possible.

Figure 10:
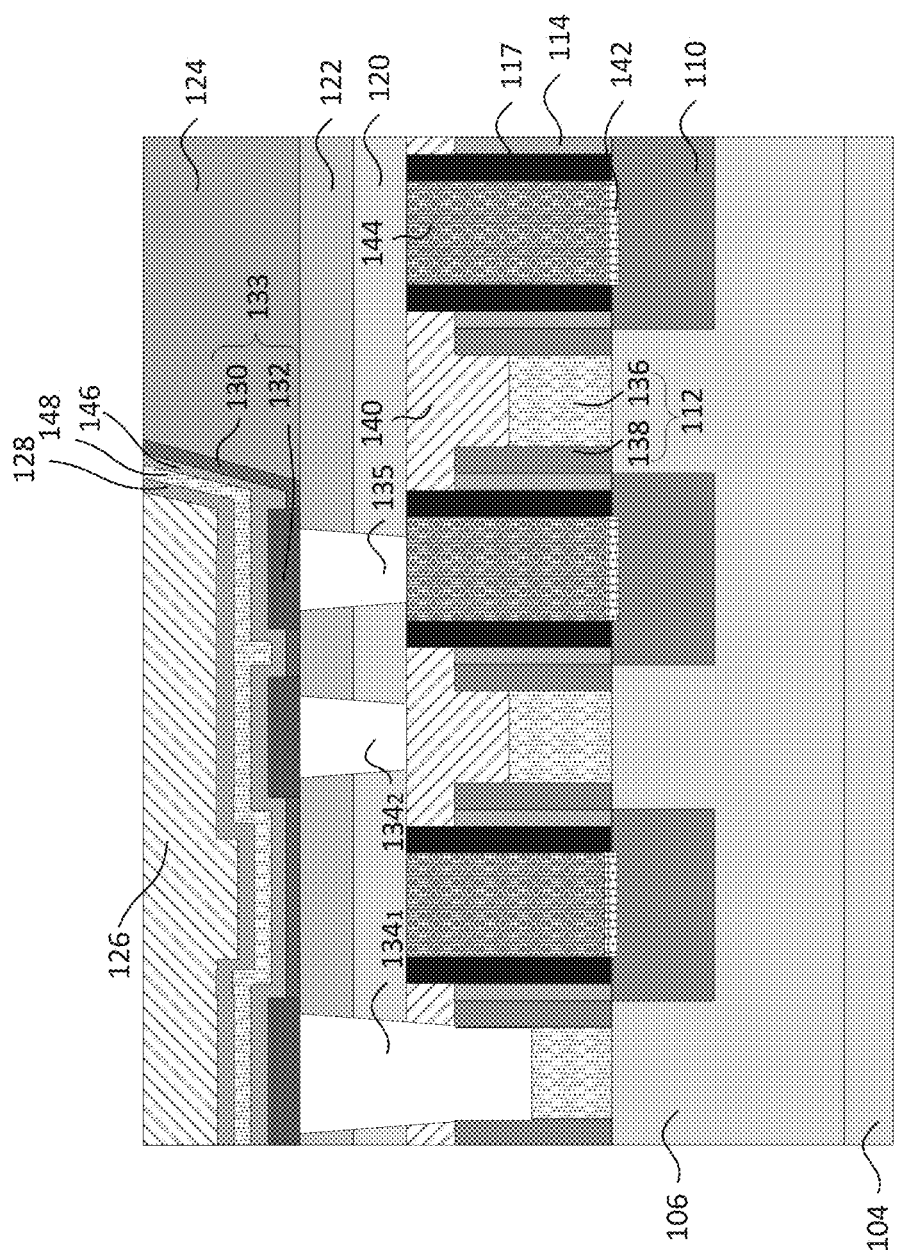

Referring to FIG. 2, in operation 216, the metal line, the seed metal layer, the one or more barrier layers, and the nitrided capping layer above the metal line dielectric layer can be polished. For example, as shown in FIG. 10, metal line 126, seed metal layer 128, barrier layers 146 and 148, and nitrided dielectric layer 130 above metal line dielectric layer 124 are polished such that metal line 126, seed metal layer 128, barrier layers 146 and 148, and nitrided dielectric layer 130 can be substantially coplanar with metal line dielectric layer 124. In some embodiments, metal line 126, seed metal layer 128, barrier layers 146 and 148, and nitrided dielectric layer 130 above metal line dielectric layer 124 can be polished by a CMP process. Because nitrided capping layer 133 can reduce (or prevent) electromigration from metal line 126 to metal vias $134_1$, $134_2$, and 135, barrier layers 146 and 148 between metal line 126 and metal vias $134_1$, $134_2$, and 135 can be eliminated or have reduced thicknesses (e.g., thickness reduced by about 20% to about 80%). Since barrier layers 146 and 148 are either reduced or eliminated and nitrided capping layer 133 has a lower resistance than barrier layers 146 and 148, the resistance and the signal delay (e.g., RC delay) in the interconnect structures can be reduced. Overall performance and yield of the IC can be enhanced.

Figure 11:
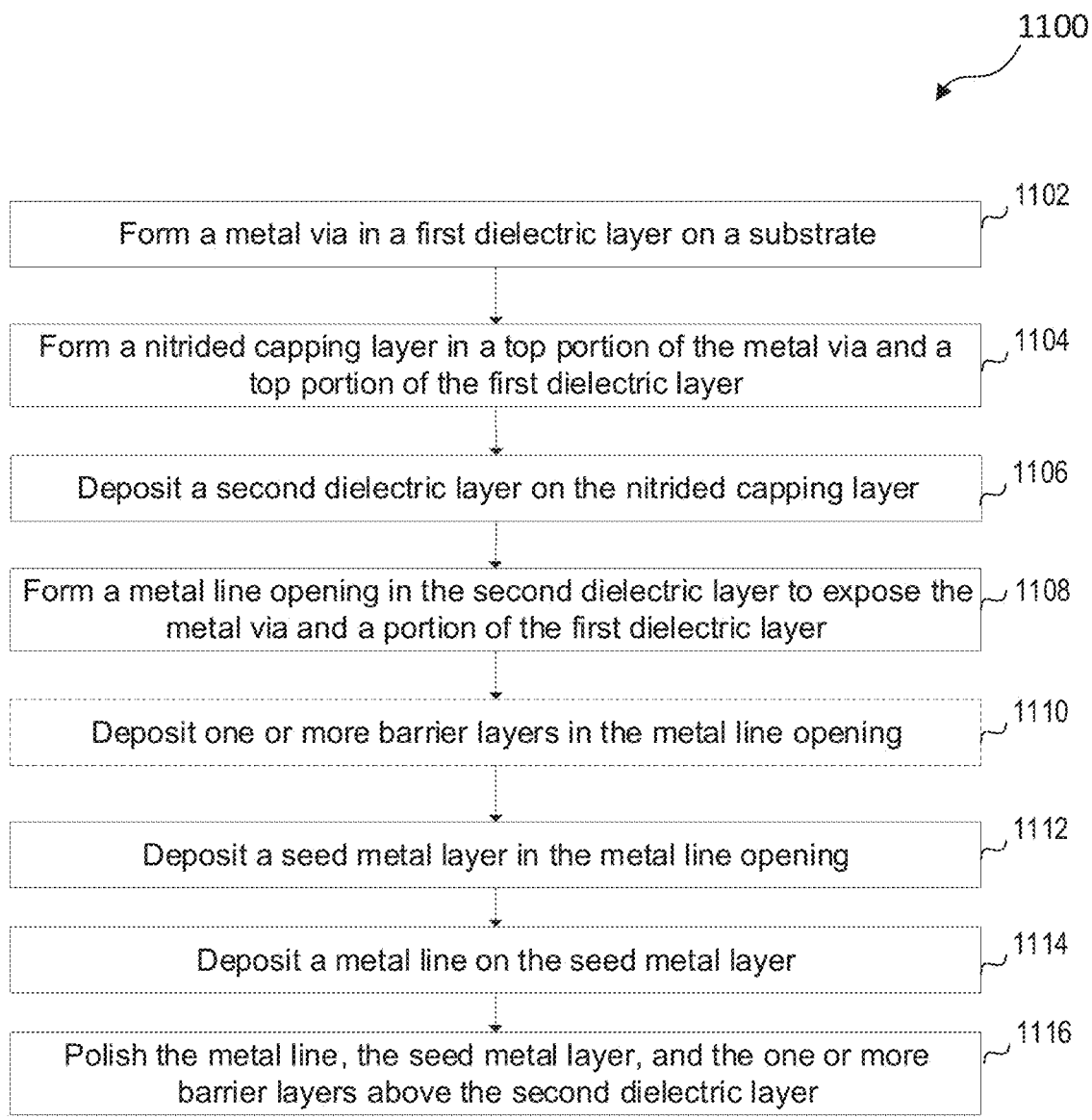
FIG. 11 is a flow diagram of another method for fabricating a semiconductor device with a nitrided capping layer, according to some embodiments.

According to some embodiments, FIG. 11 is a flow diagram describing another method 1100 for fabricating FET 100, as shown in FIGS. 1A-1I. For illustrative purposes, the operations illustrated in FIG. 11 will be described with reference to the example fabrication process for fabricating FET 100 as illustrated in FIGS. 12-19. FIGS. 12, 13A, and 14-19 are cross-sectional views of FET 100 at various stages of fabrication, according to some embodiments. Additional fabrication operations can be performed between the various operations of method 1100 and are omitted for simplicity. These additional fabrication operations are within the spirit and the scope of this disclosure. Moreover, not all operations may be required to perform the disclosure provided herein. Additionally, some of the operations can be performed simultaneously or in a different order than the ones shown in FIG. 11. It should be noted that method 1100 may not produce a complete FET 100. Accordingly, it is understood that additional processes can be provided before, during, and after method 1100, and that some other processes may only be briefly described herein. Elements in FIGS. 12, 13A, and 14-19 with the same annotations as elements in FIGS. 1A-1I are described above.

Referring to FIG. 11, in operation 1102, a metal via can be formed in a metal via dielectric layer disposed on a substrate. The substrate can include transistor structures. For example, as shown in FIG. 12, gate metal vias $134_1$ and $134_2$ and S/D metal via 135 are formed in metal via dielectric layers 120 and 122. Metal via dielectric layers 120 and 122 can be deposited and gate metal vias $134_1$ and $134_2$ and S/D metal via 135 can be formed in a manner similar to that described with reference to FIG. 3 and operation 202 of FIG. 2.

Figure 13A:
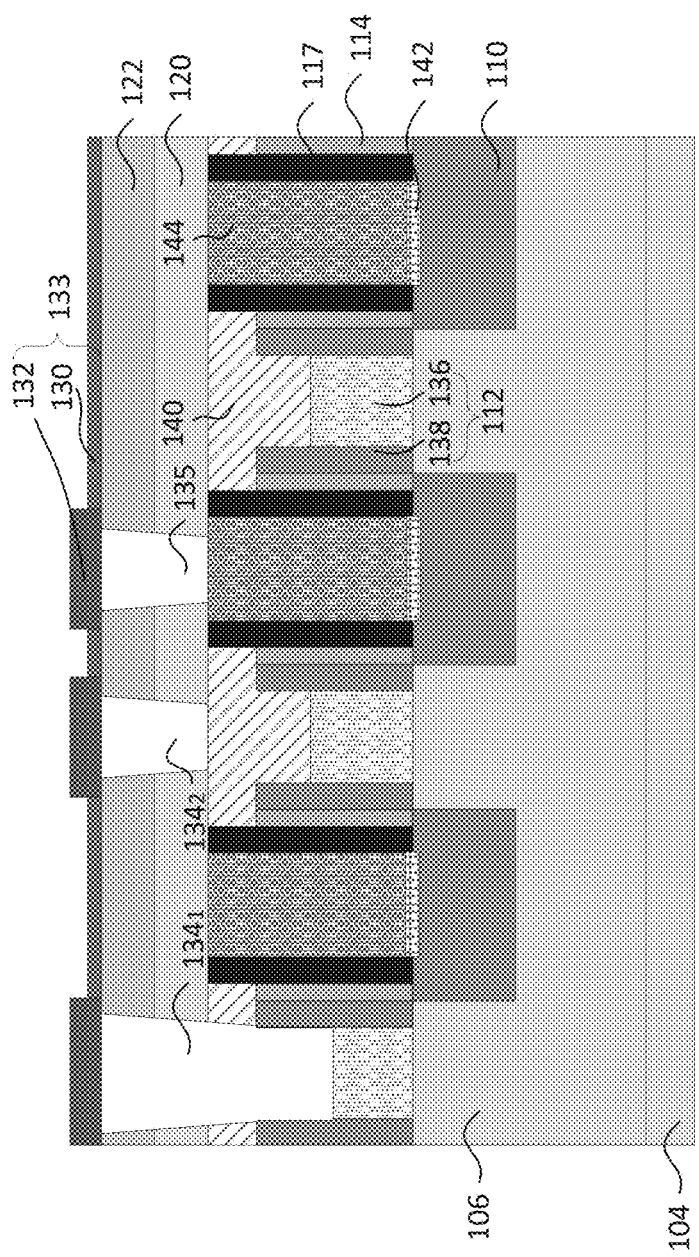

Referring to FIG. 11, in operation 1104, a nitrided capping layer can be formed in a top portion of the metal vias and a top portion of the metal via dielectric layer. For example, as shown in FIG. 13A, a nitrided capping layer 133 is formed. Nitrided capping layer 133 can include a nitrided metal layer 132 formed in a top portion of gate metal vias $134_1$ and $134_2$ and S/D metal via 135. Nitrided capping layer 133 can include a nitrided dielectric layer 130 formed in a top portion of metal via dielectric layer 124. There can be two processes for forming nitrided capping layer 133. The first process can be a nitridation treatment process. The second process can be a $N_2$ ion implantation process. Nitrided capping layer 133 can be formed in a manner similar to that described with reference to FIG. 6A and operation 208 of FIG. 2.

Figure 13B:
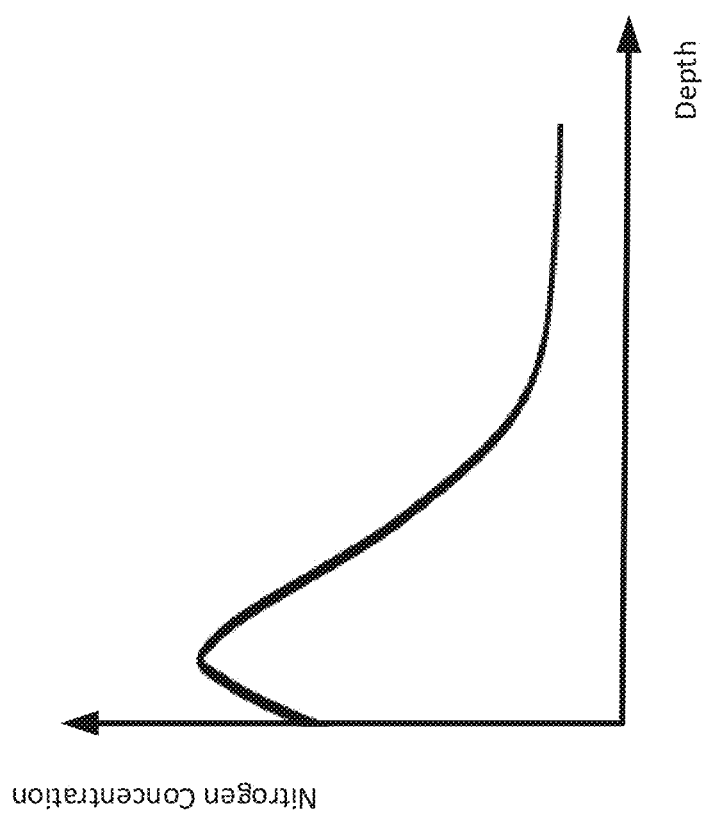

Referring to FIG. 13B, the concentration of the nitrogen atoms in nitrided capping layer 133 can vary in a manner similar to that described with reference to FIG. 6B.

Figure 14:
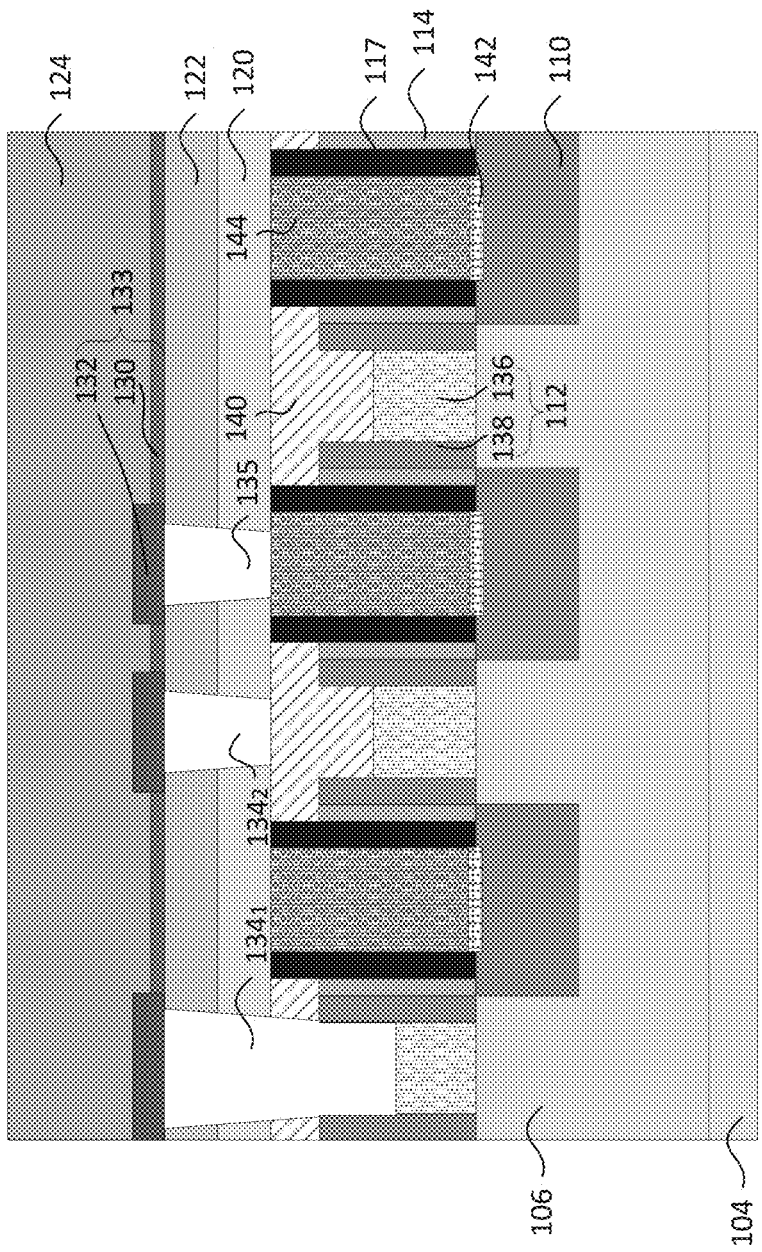

Referring to FIG. 11, in operation 1106, a metal line dielectric layer can be deposited on the nitrided capping layer. For example, as shown in FIG. 14, a metal line dielectric layer 124 is deposited on nitrided capping layer 133. Metal line dielectric layer 124 can be deposited in a manner similar to that described with reference to FIG. 4 and operation 204 of FIG. 2.

Figure 15:
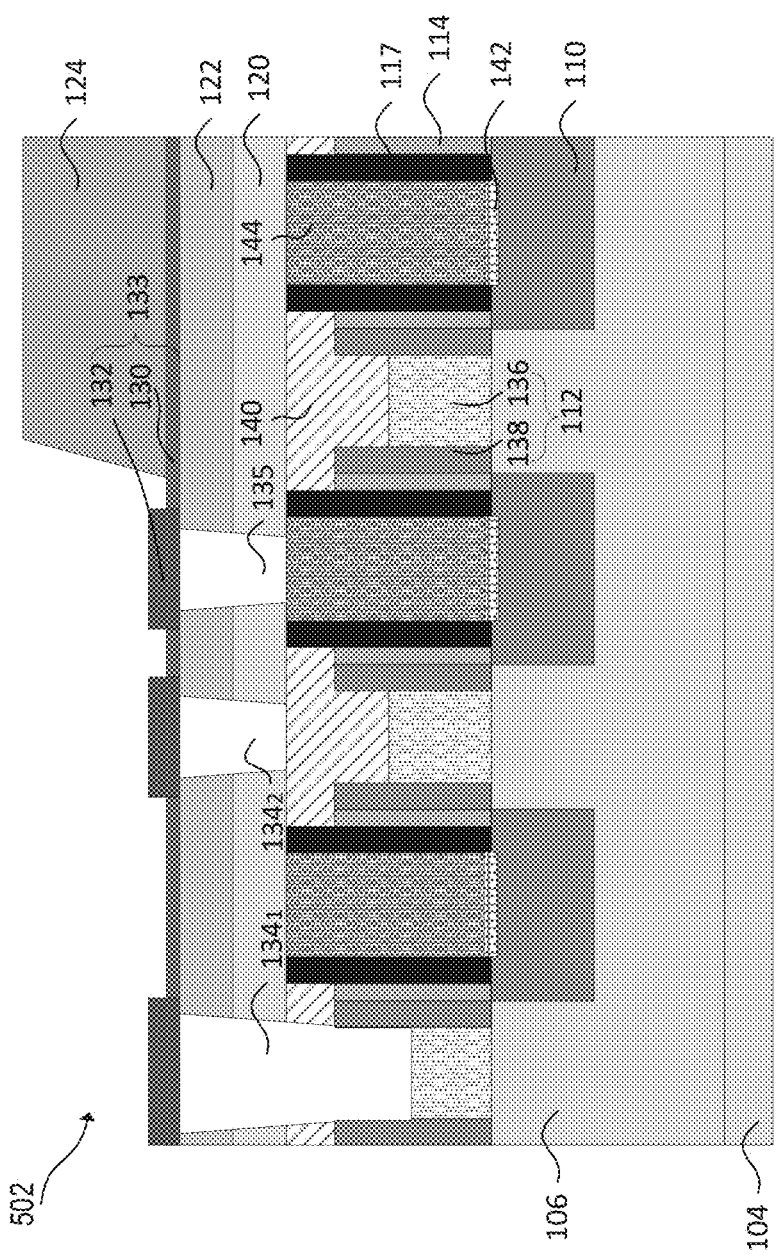
Figure 15:
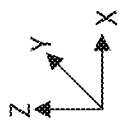

Referring to FIG. 11, in operation 1108, a metal line opening can be formed in the metal line dielectric layer to expose the nitrided capping layer disposed on the metal vias and portions of the metal via dielectric layer. For example, as shown in FIG. 15, a metal line opening 502 is formed in metal line dielectric layer 124 to expose nitrided capping layer 133 disposed on gate metal vias $134_1$ and $134_2$ and S/D metal via 135 and portions of metal via dielectric layer 122. Metal line opening 502 can be formed in a manner similar to that described with reference to FIG. 5 and operation 206 of FIG. 2.

Figure 16:
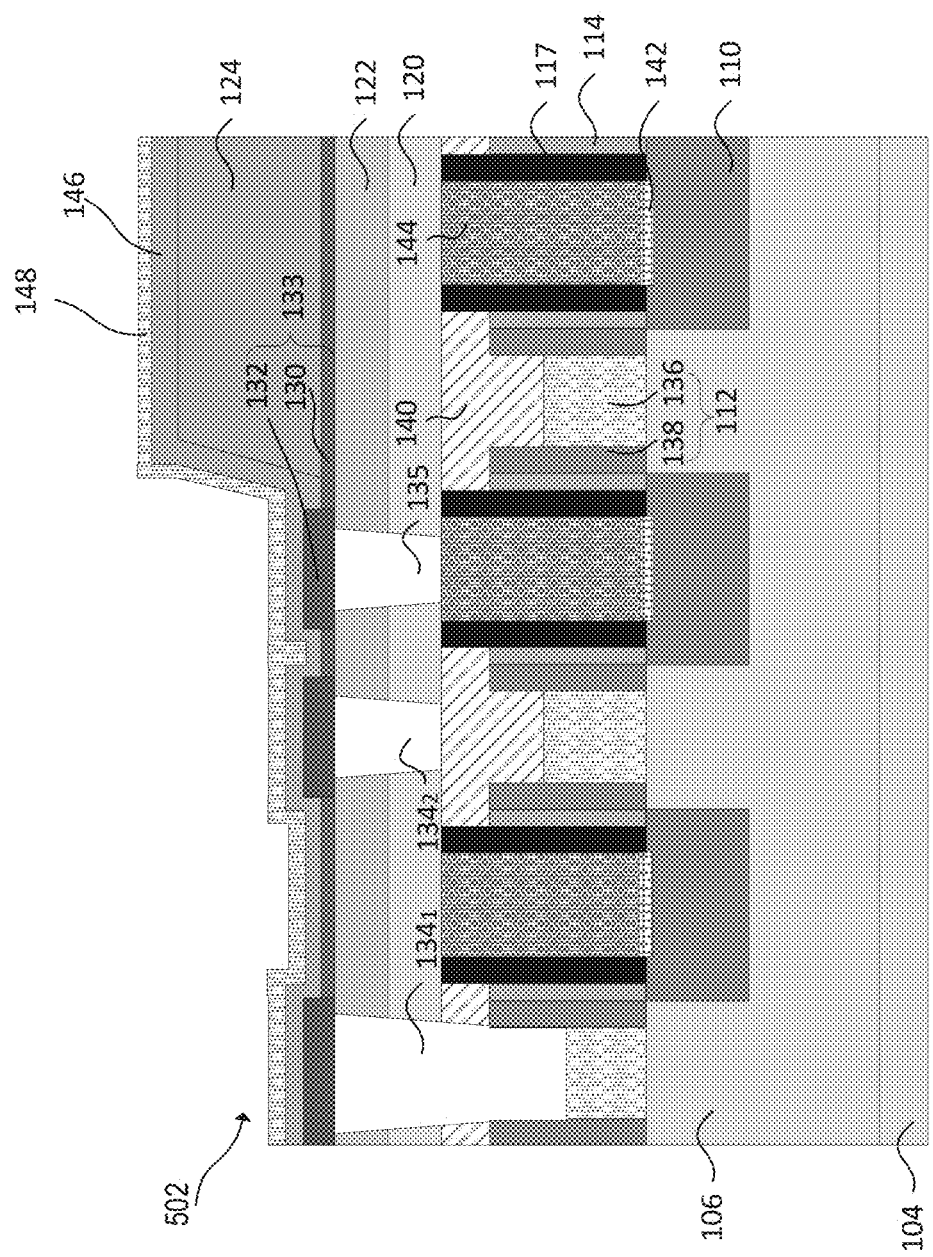

Referring to FIG. 11, in operation 1110, one or more barrier layers can be deposited in the metal line opening. For example, as shown in FIG. 16, barrier layers 146 and 148 are deposited in metal line opening 502. Barrier layers 146 and 148 can be deposited in a manner similar to that described with reference to FIG. 7 and operation 210 of FIG. 2. In some embodiments, barrier layer 146 can be deposited without barrier layer 148. In some embodiments, barrier layer 148 can be deposited without barrier layer 146. In some embodiments, neither barrier layer 146 nor barrier layer 148 is deposited.

Figure 17:
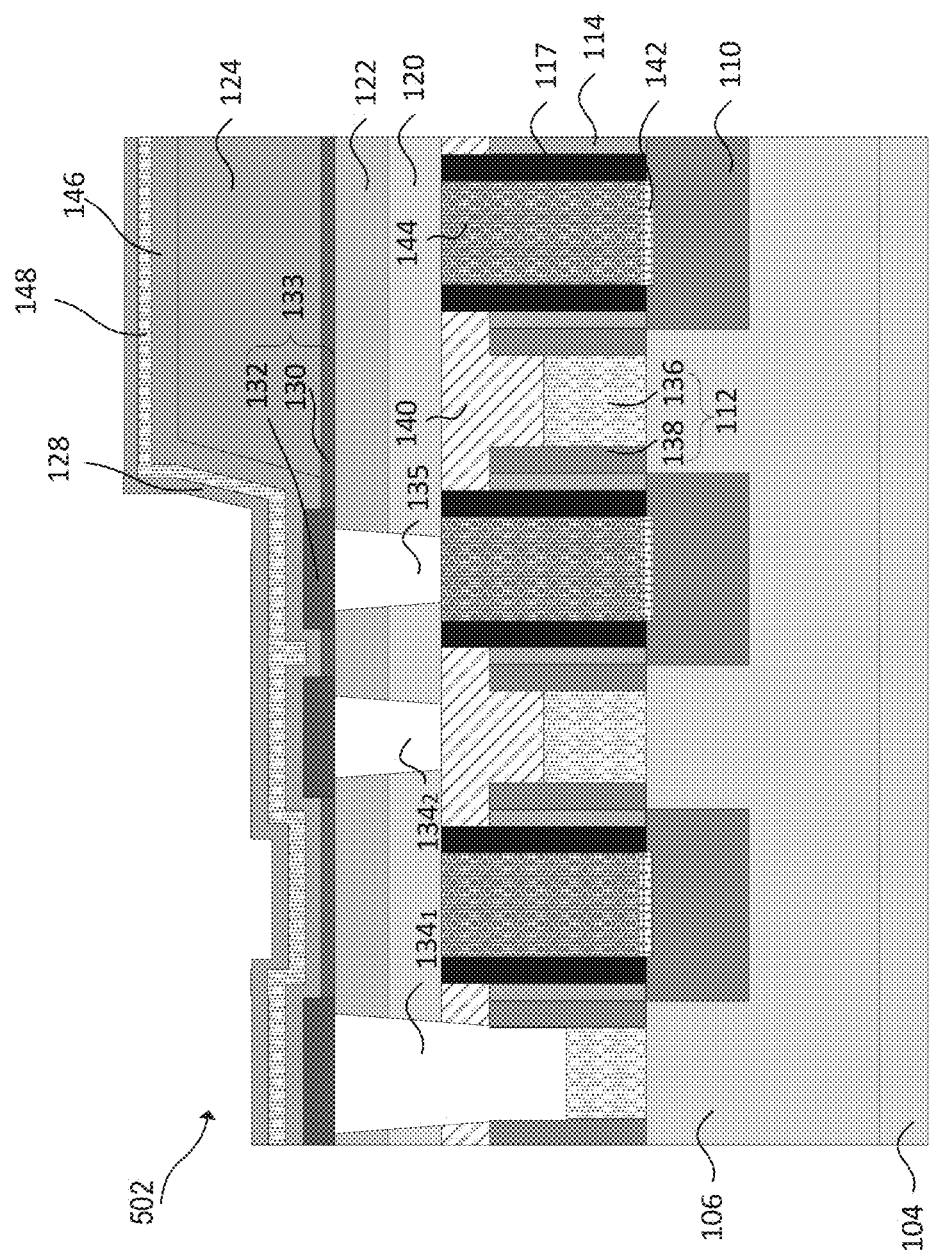

Referring to FIG. 11, in operation 1112, a seed metal layer can be deposited in the metal line opening. For example, as shown in FIG. 17, a seed metal layer 128 is deposited in metal line opening 502. In some embodiments, seed metal layer 128 can be deposited on barrier layers 146 and 148. Seed metal layer 128 can be deposited in a manner similar to that described with reference to FIG. 8 and operation 212 of FIG. 2. Seed metal layer 128 can be used to improve adhesion and metal filling quality. In some embodiments, seed metal layer 128 can be omitted.

Figure 18:
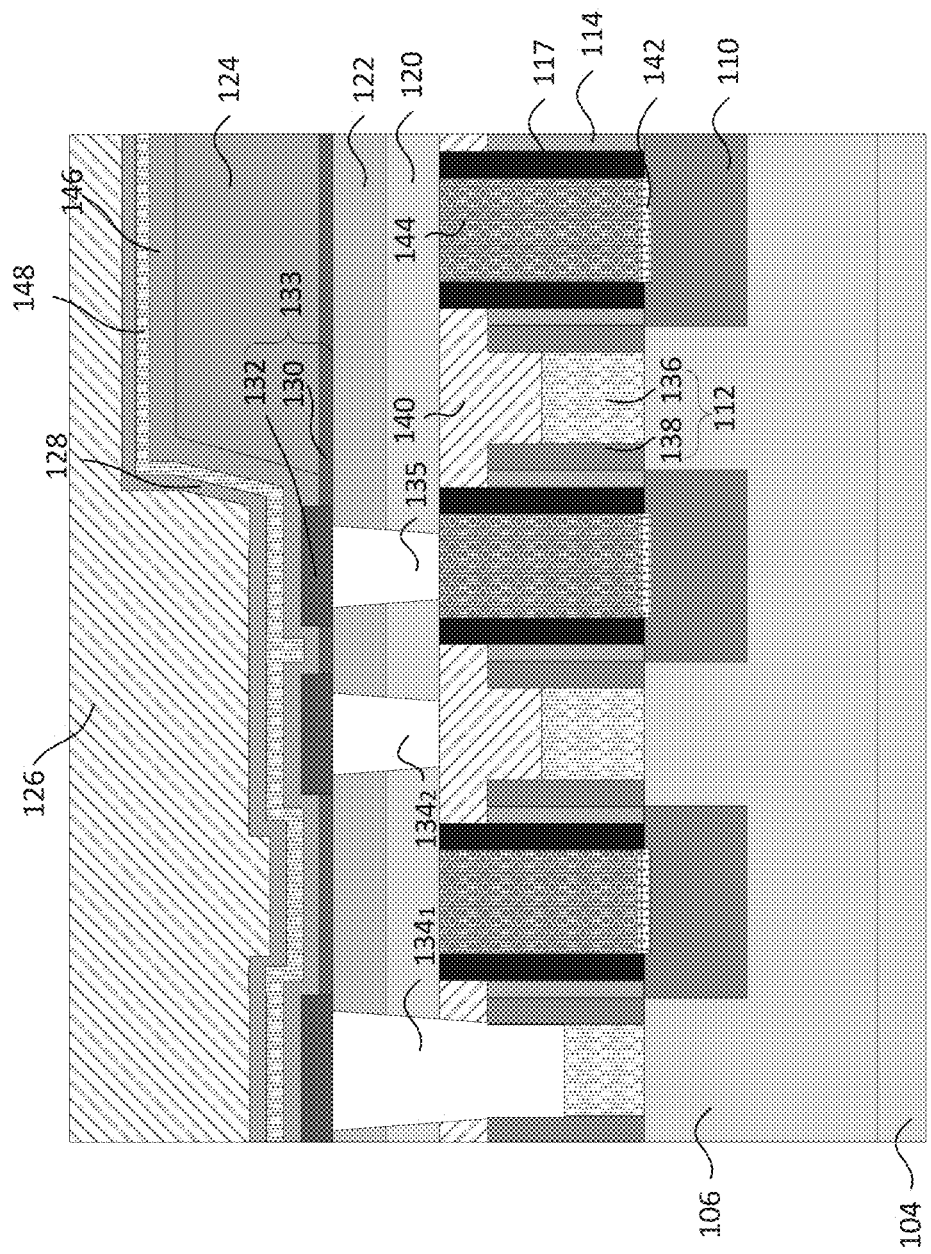

Referring to FIG. 11, in operation 1114, a metal line can be deposited on the seed metal layer. For example, as shown in FIG. 18, a metal line 126 is deposited on seed metal layer 128. Metal line 126 can be deposited in metal line opening 502 and on seed metal layer 128 in a manner similar to that described with reference to FIG. 9 and operation 214 of FIG. 2.

Figure 19:
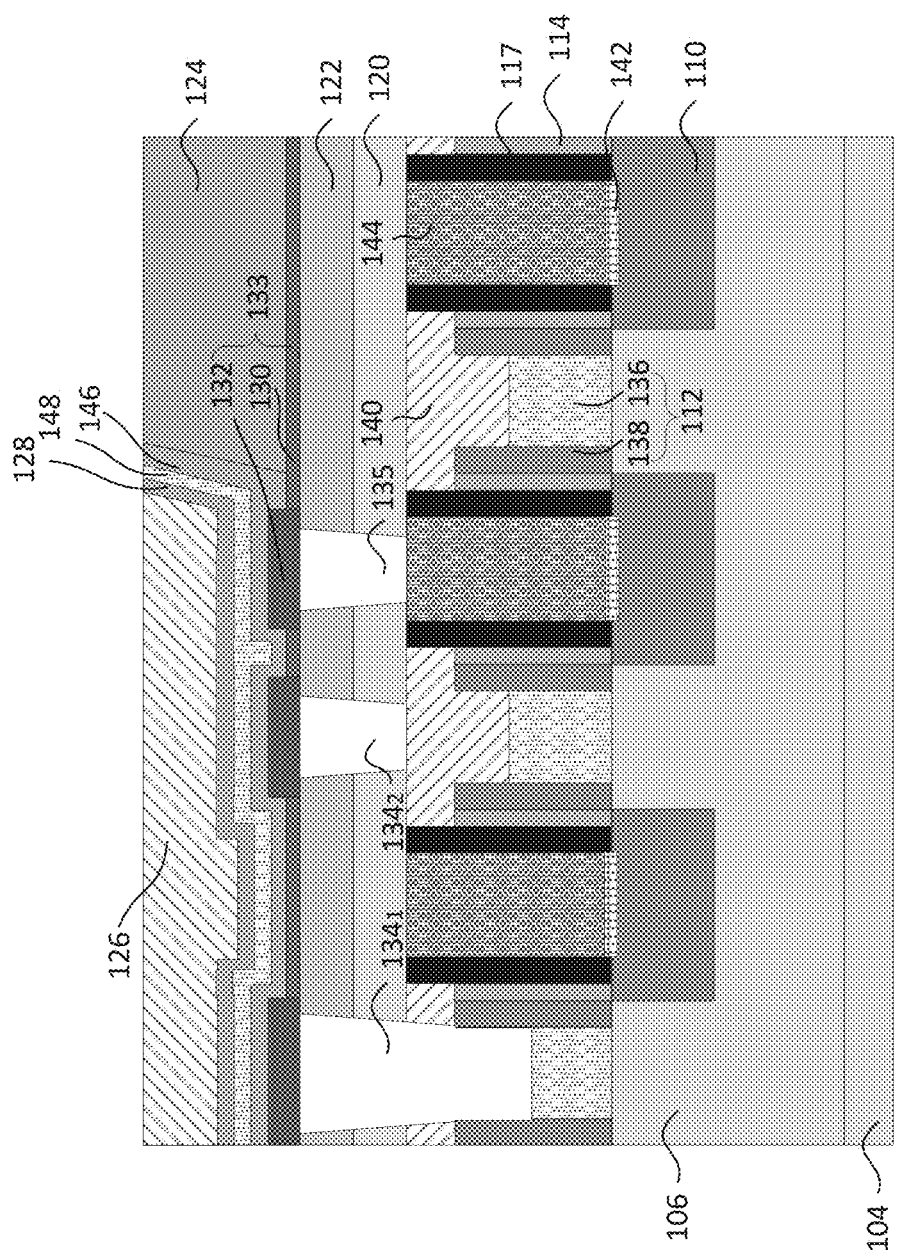

Referring to FIG. 11, in operation 1116, the metal line, the seed metal layer, and the one or more barrier layers can be polished. For example, as shown in FIG. 19, metal line 126, seed metal layer 128, and barrier layers 146 and 148 are polished such that metal line 126, seed metal layer 128, and barrier layers 146 and 148 can be substantially coplanar with metal line dielectric layer 124. In some embodiments, metal line 126, seed metal layer 128, and barrier layers 146 and 148 can be polished in a manner similar to that described with reference to FIG. 10 and operation 216 of FIG. 2. Because nitrided capping layer 133 can reduce (or prevent) electromigration from metal line 126 to metal vias $134_1$, $134_2$, and 135, barrier layers 146 and 148 between metal line 126 and metal vias $134_1$, $134_2$, and 135 can be eliminated or have reduced thicknesses (e.g., thickness reduced by about 20% to about 80%). Since barrier layers 146 and 148 are either reduced or eliminated and nitrided capping layer 133 has a lower resistance than barrier layers 146 and 148, the resistance and the signal delay (e.g., RC delay) in the interconnect structures can be reduced. Overall performance and yield of the IC can be enhanced.

The present disclosure provides example FET devices (e.g., FET 100, GAA FETs, finFETs, and planar FETs) with a nitrided capping layer (e.g., nitrided capping layer 133) in a semiconductor device and/or in an IC and example methods (e.g., methods 200 and 1100) for fabricating the same. The nitrided capping layer can be formed on the metal vias (e.g., metal vias $134_1$, $134_2$, and 135) and between the metal lines (e.g., metal line 126) and the metal vias. The nitrided capping layer can provide low resistance and reduce (or prevent) electromigration from the metal lines to the metal vias. There can be two methods for forming the nitrided capping layer on the metal vias.

In the first method, a metal line dielectric layer (e.g., metal line dielectric layer 124) can be formed on the metal vias. A metal line opening (e.g., metal line opening 502) can be formed in the metal line dielectric layer to expose the metal vias. The nitrided capping layer can be formed on the metal vias and the sidewalls of the metal line opening. The nitrided capping layer can be formed by nitridation treatment and nitrogen ion implantation. A seed metal layer (e.g., seed metal layer 128) can be deposited in the metal line opening and the metal line can be formed on the seed metal layer. In some embodiments, barrier layers (e.g., barrier layers 146 and 148) with reduced thicknesses (e.g., thickness reduced by about 20% to about 80%) can be formed before the seed metal layer and the metal line can be formed in the metal line opening.

In the second method, the nitrided capping layer can be formed on the metal vias before the metal line dielectric layer is formed on the metal vias. The nitrided capping layer can be formed by nitridation treatment and nitrogen ion implantation. After the nitrided capping layer is formed, the metal line dielectric layer can be formed on the nitrided capping layer and the metal line opening can be formed in the metal line dielectric layer. The seed metal layer can be deposited in the metal line opening and the metal line can be formed on the seed metal layer. In some embodiments, barrier layers with reduced thicknesses (e.g., thickness reduced by about 20% to about 80%) can be formed before the seed metal layer and the metal line can be formed in the metal line opening. Because the nitrided capping layer can reduce (or prevent) electromigration from the metal lines to the metal vias, the barrier layers can be eliminated or have reduced thicknesses (e.g., thickness reduced by about 20% to about 80%). Since the nitrided capping layer has a lower resistance than the barrier layers, a benefit of the present disclosure, among others, is to lower the resistance and the signal delay (e.g., RC delay) in the interconnect structures, thus enhancing the overall performance and yield of the IC.

In some embodiments, a method includes forming a first conductive structure in a first dielectric layer on a substrate, depositing a second dielectric layer on the first conductive structure and the first dielectric layer, and forming an opening in the second dielectric layer to expose the first conductive structure and a portion of the first dielectric layer. The method further includes forming a nitrided layer on a top portion of the first conductive structure, a top portion of the portion of the first dielectric layer, sidewalls of the opening, and a top portion of the second dielectric layer, and forming a second conductive structure in the opening, where the second conductive structure is in contact with the nitrided layer.

In some embodiments, a method includes forming a transistor structure on a substrate, forming a metal via in a first dielectric layer disposed on the transistor structure, and forming a nitrided layer on a top portion of the metal via and a top portion of the first dielectric layer. The method further includes depositing a second dielectric layer on the nitrided layer, forming an opening in the second dielectric layer to expose the metal via and a portion of the first dielectric layer, and forming a metal line in the opening, where the metal line is in contact with the nitrided layer.

In some embodiments, a structure includes a transistor structure disposed on a substrate and a first conductive structure in a first dielectric layer disposed on the transistor structure, where the first conductive structure is in contact with a gate conductive structure, a gate metal fill layer, and a source/drain (S/D) conductive structure of the transistor structure. The structure further includes a nitrided layer on the first conductive structure, where the nitrided layer extends over side surfaces of the first conductive structure. The structure further includes a second conductive structure in a second dielectric layer disposed on the first dielectric layer, where the second conductive structure is in contact with the nitrided layer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first conductive structure in a first dielectric layer on a substrate;
    depositing a second dielectric layer on the first conductive structure and the first dielectric layer;
    forming an opening in the second dielectric layer to expose the first conductive structure and a portion of the first dielectric layer;
    forming a nitrided layer by performing a nitridation treatment to a top portion of the exposed first conductive structure, a top portion of the portion of the first dielectric layer, sidewalls of the opening, and a top portion of the second dielectric layer; and
    forming a second conductive structure in the opening, wherein the second conductive structure is in contact with the nitrided layer.

2. The method of claim 1, wherein forming the nitrided layer comprises performing a nitridation process using nitrogen ($N_2$) and ammonia ($NH_3$) with a gas flow rate between about 5 sccm and about 1000 sccm.

3. The method of claim 1, wherein forming the nitrided layer comprises performing a nitrogen implantation process using $N_2$ with an implantation dose greater than about $1\times10^{15}$ atoms/cm$^2$.

4. The method of claim 1, wherein forming the nitrided layer comprises increasing a volume of the top portion of the first conductive structure between about 1.1 times and about 1.6 times.

5. The method of claim 1, wherein forming the nitrided layer comprises reducing a conductivity of the top portion of the first conductive structure to between about $1\times10^3$ S/cm and about $1\times10^6$ S/cm.

6. The method of claim 1, wherein forming the nitrided layer on the top portion of the portion of the first dielectric layer comprises replacing oxygen (O) atoms in the top portion of the portion of the first dielectric layer with nitrogen (N) atoms.

7. The method of claim 1, wherein forming the nitrided layer comprises forming the nitrided layer with a nitrogen concentration initially increasing and then exponentially decreasing from a top surface of the nitrided layer to a bottom surface of the nitrided layer.

8. The method of claim 1, further comprising forming a transistor structure on the substrate, wherein the first conductive structure is in contact with a gate conductive structure, a gate metal fill layer, and a source/drain (S/D) conductive structure of the transistor structure.

9. The method of claim 1, wherein forming the second conductive structure comprises:
    depositing a seed layer in the opening; and
    polishing the second conductive structure, the seed layer, and the nitrided layer in the top portion of the second dielectric layer.

10. The method of claim 1, wherein forming the second conductive structure comprises depositing, in the opening, a barrier layer with a thickness between about 0.2 nm and about 2 nm.

11. A method, comprising:
    forming a transistor structure on a substrate;
    forming a metal via in a first dielectric layer disposed on the transistor structure;
    forming a nitrided layer including a nitrided metal layer and a nitrided dielectric layer on a top portion of the metal via and a top portion of the first dielectric layer, respectively;
    depositing a second dielectric layer on the nitrided layer;
    forming an opening in the second dielectric layer to expose the nitrided metal layer; and
    forming a metal line in the opening, wherein the metal line is in contact with the nitrided metal layer.

12. The method of claim 11, wherein forming the nitrided layer comprises performing a nitridation process using nitrogen ($N_2$) and ammonia ($NH_3$) with a gas flow rate between about 5 sccm and about 1000 sccm.

13. The method of claim 11, wherein forming the nitrided layer comprises performing a nitrogen implantation process using $N_2$ with an implantation dose greater than about $1\times10^{15}$ atoms/cm$^2$.

14. The method of claim 11, wherein forming the nitrided layer comprises increasing a volume of the top portion of the metal via between about 1.1 times and about 1.6 times.

15. The method of claim 11, wherein forming the nitrided layer on the top portion of the first dielectric layer comprises replacing oxygen (O) atoms in the top portion of the first dielectric layer with nitrogen (N) atoms.

16. The method of claim 11, wherein forming the metal line comprises:
    depositing, in the opening, one or more barrier layers with a thickness between about 0.2 nm and about 2 nm;
    depositing a seed layer on the one or more barrier layers; and
    polishing the metal line, the seed layer, and the one or more barrier layers.

17. A method, comprising:
    depositing a dielectric layer on a substrate;
    forming a metal line opening in the dielectric layer to expose a conductive via contact;
    nitriding a top portion of the exposed conductive via contact, a dielectric sidewall of the metal line opening, and a top portion of the dielectric layer; and
    forming a metal line in the metal line opening.

18. The method of claim 17, wherein nitriding comprises performing a nitridation process using nitrogen ($N_2$) and ammonia ($NH_3$) with a gas flow rate between about 5 sccm and about 1000 sccm.

19. The method of claim 17, wherein nitriding comprises performing a nitrogen implantation process using $N_2$ with an implantation dose greater than about $1\times10^{15}$ atoms/cm$^2$.

20. The method of claim 17, wherein nitriding comprises increasing a volume of the top portion of the conductive via contact between about 1.1 times and about 1.6 times.

* * * * *